United States Patent [19]

Suyama

[11] Patent Number: 4,901,572

[45] Date of Patent: Feb. 20, 1990

[54] METHOD AND APPARATUS FOR MEASURING WEDGE

[75] Inventor: Toshimitsu Suyama, Oomorinishi, Japan

[73] Assignee: Kabushiki Kaisha Toshiba, Kawasaki, Japan

[21] Appl. No.: 311,841

[22] Filed: Feb. 17, 1989

[30] Foreign Application Priority Data

Feb. 22, 1988 [JP] Japan .................................. 63-39295

[51] Int. Cl.⁴ .............................................. G01H 1/14
[52] U.S. Cl. ........................................ 73/572; 356/375
[58] Field of Search ................. 73/572, 573, 576, 649, 73/655, 658, 661; 324/158 MG; 310/214; 356/375, 1

[56] References Cited

U.S. PATENT DOCUMENTS

| | | | |
|---|---|---|---|
| 4,136,312 | 1/1979 | Salon et al. ................. | 324/158 MG |
| 4,325,640 | 4/1982 | Dreyfus et al. ..................... | 356/375 |
| 4,422,320 | 12/1983 | Moorby et al. ........................ | 73/572 |
| 4,653,318 | 3/1987 | Jadwin et al. .......................... | 73/151 |

FOREIGN PATENT DOCUMENTS

| | | | |
|---|---|---|---|
| 60-58551 | 4/1985 | Japan ..................................... | 73/572 |
| 60-202315 | 10/1985 | Japan ..................................... | 73/572 |
| 60-207013 | 10/1985 | Japan ..................................... | 73/572 |

OTHER PUBLICATIONS

Hydrogenerator Coil Wedges Easy to Check, Vin Tek Inc., Richland Electrical World 1986-12 (pp. 57–58).

Primary Examiner—John Chapman
Assistant Examiner—Louis M. Arana
Attorney, Agent, or Firm—Cushman, Darby & Cushman

[57] ABSTRACT

A wedge measuring apparatus comprising a measuring head, capable of being inserted between a stator and a rotor of a revolving electric machine, for testing a coil-urging state of wedges inserted in a slot, and a mechanism for moving the measuring head in the longitudinal direction of the stator and the circumferential direction of the rotor. A test for the coil-urging state is performed to prevent a coil from extending from an opening in the radial direction. In this case, the coil is inserted in a slot having the opening formed in a stator wall surface opposite to the rotor, and the slots are formed along the axial direction of the stator core.

36 Claims, 27 Drawing Sheets

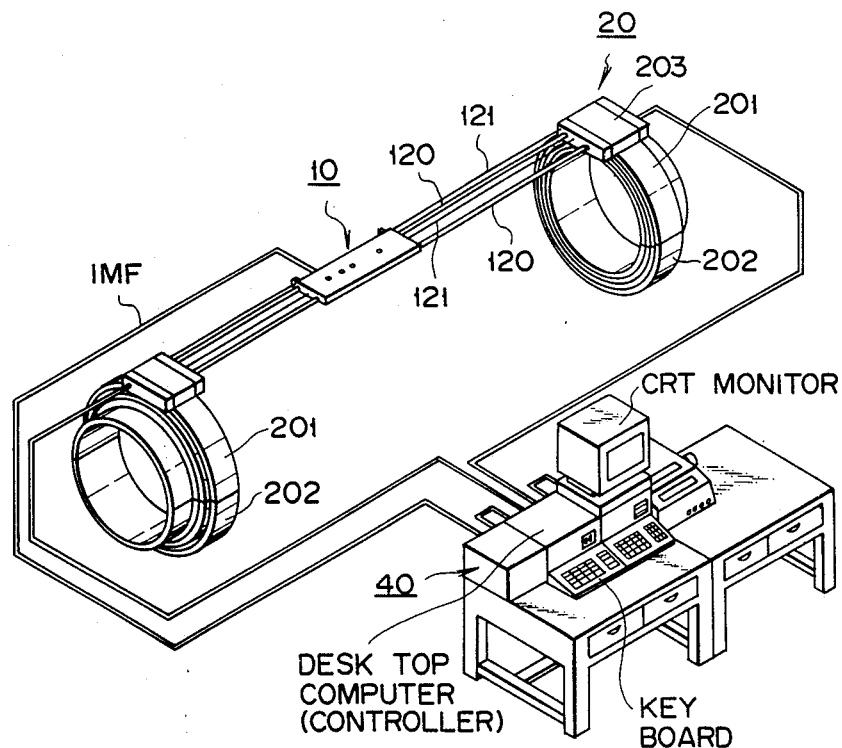
F I G. 1
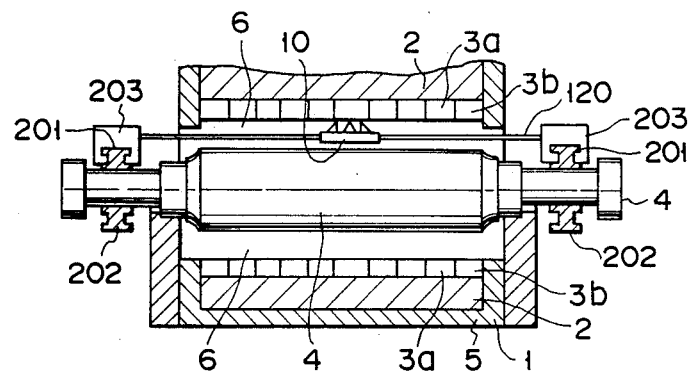
F I G. 2

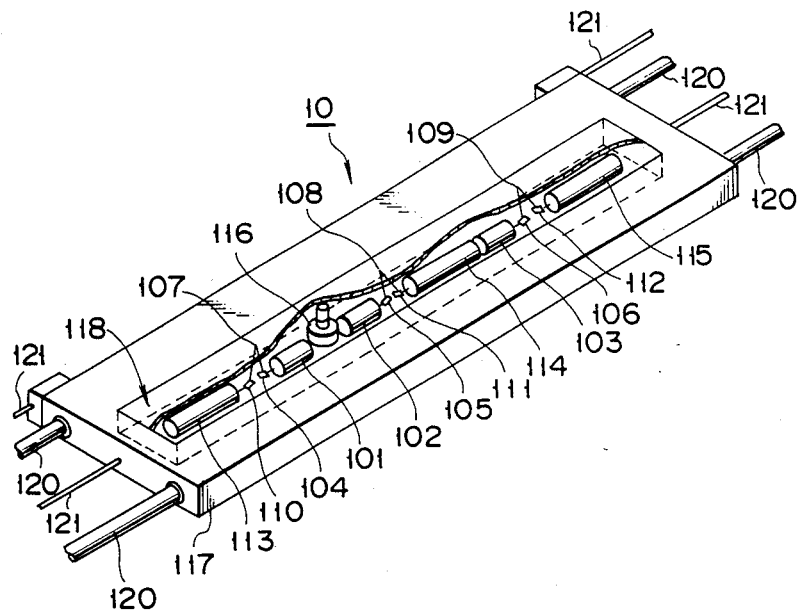
F I G. 11
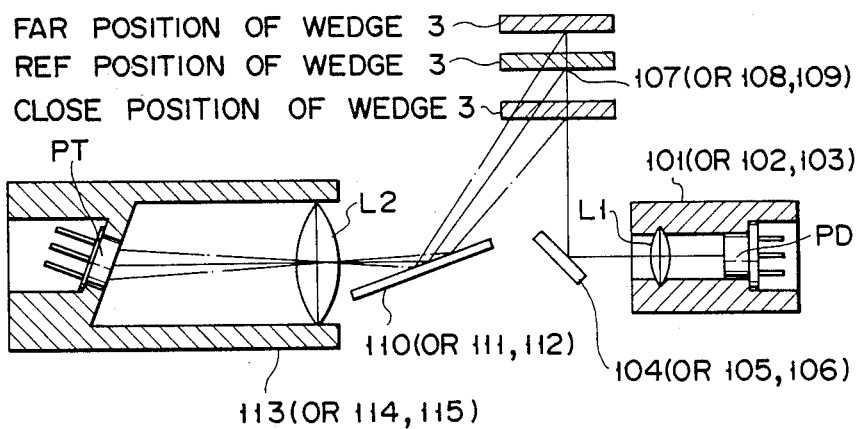
F I G. 12

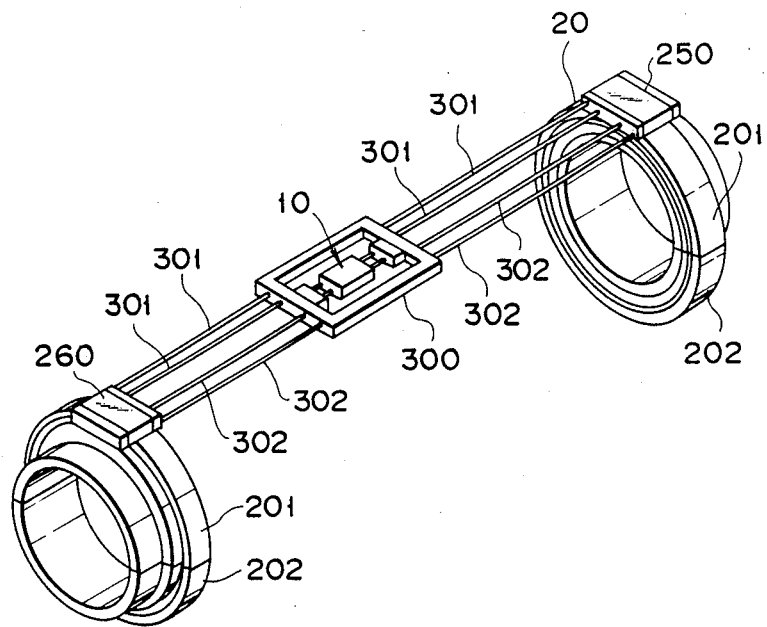
F I G. 21

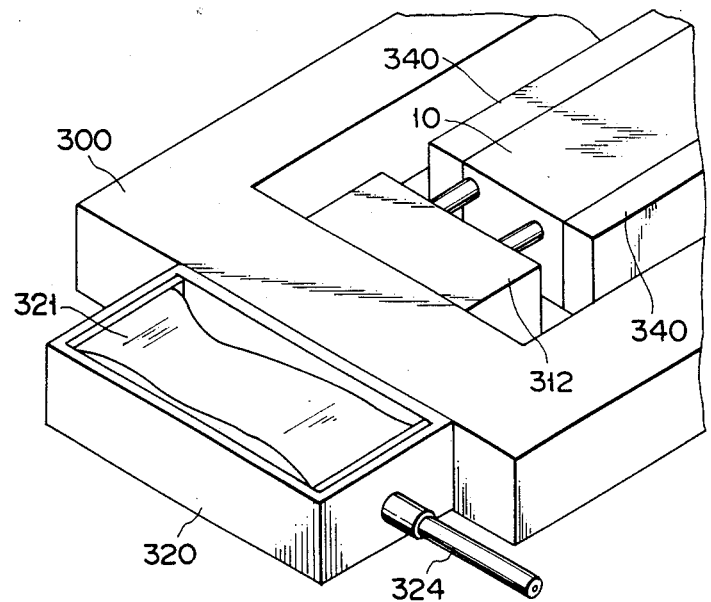
F I G. 29
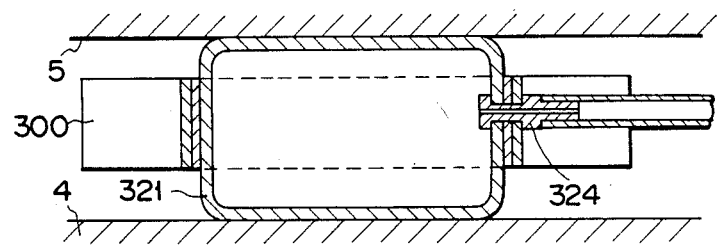
F I G. 30

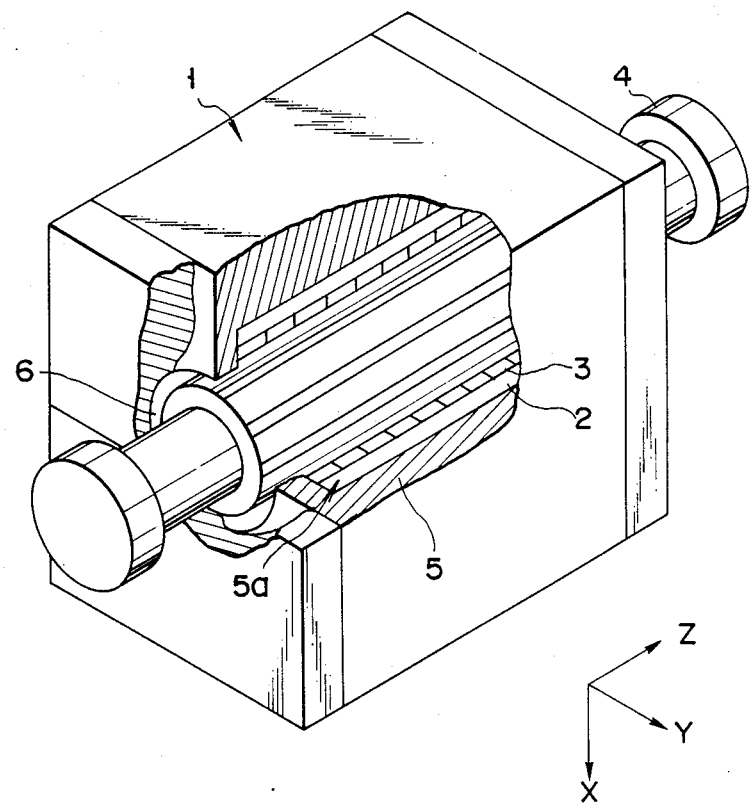
F I G. 31

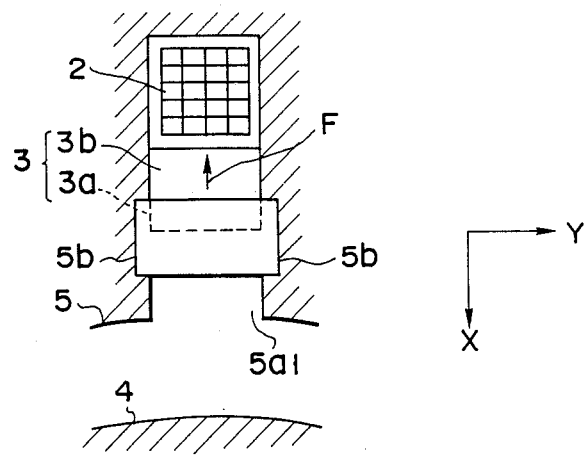
F I G. 32
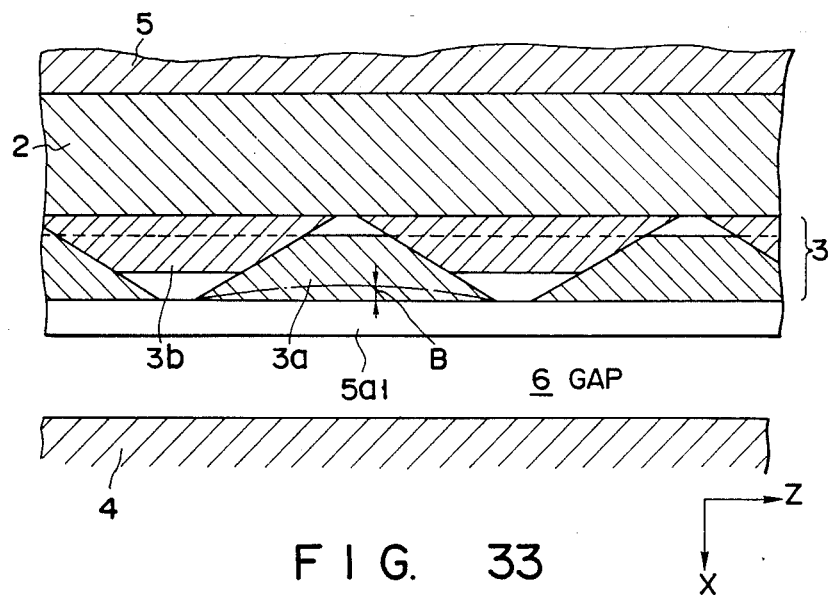
F I G. 33

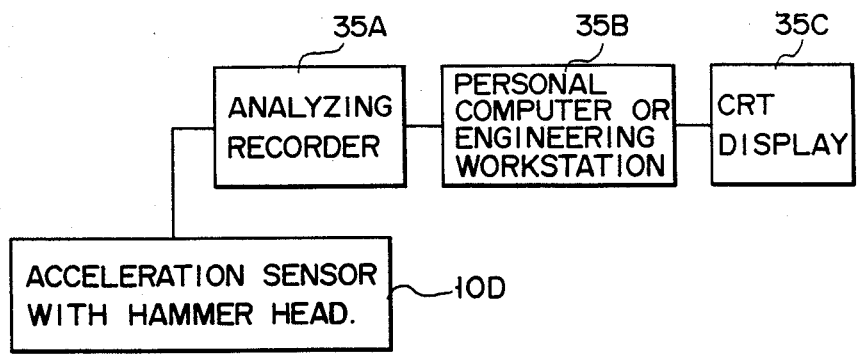
F I G. 35
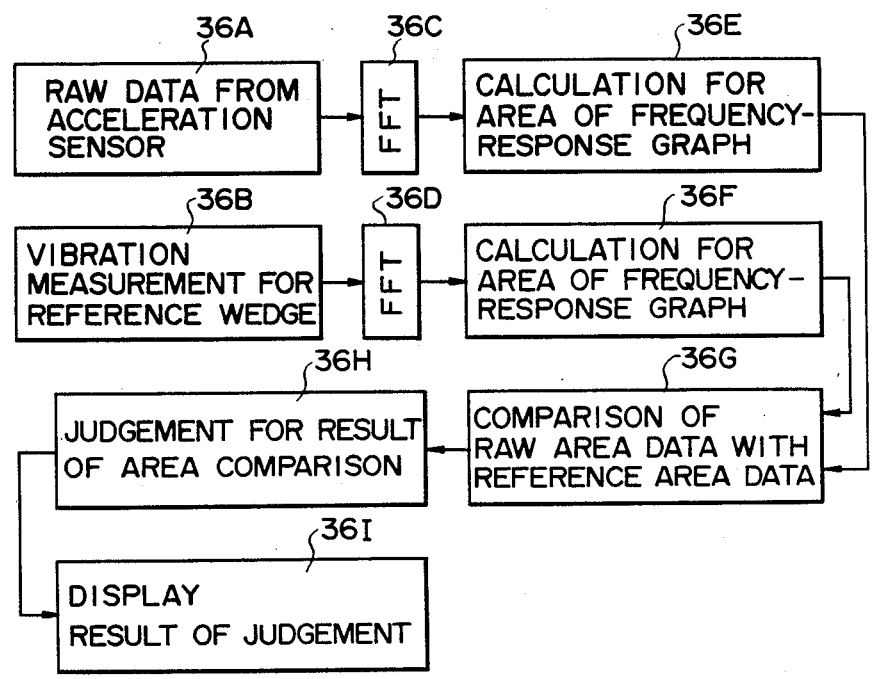
F I G. 36

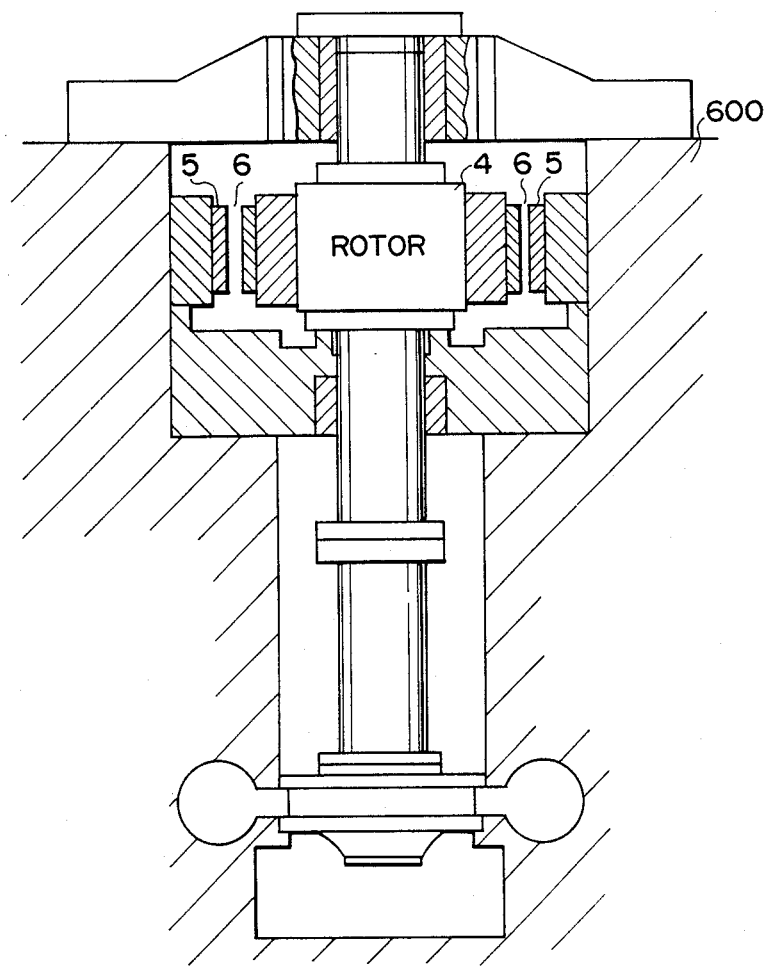
F I G. 42

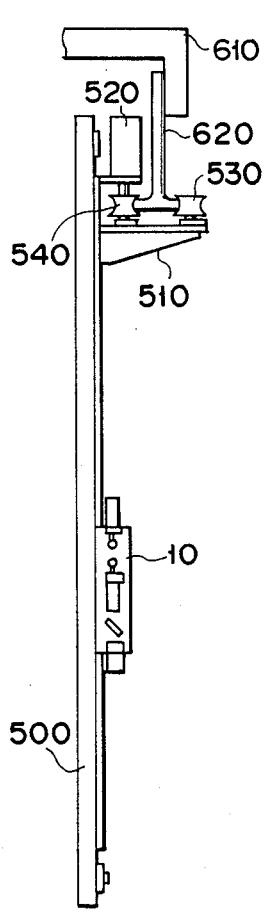
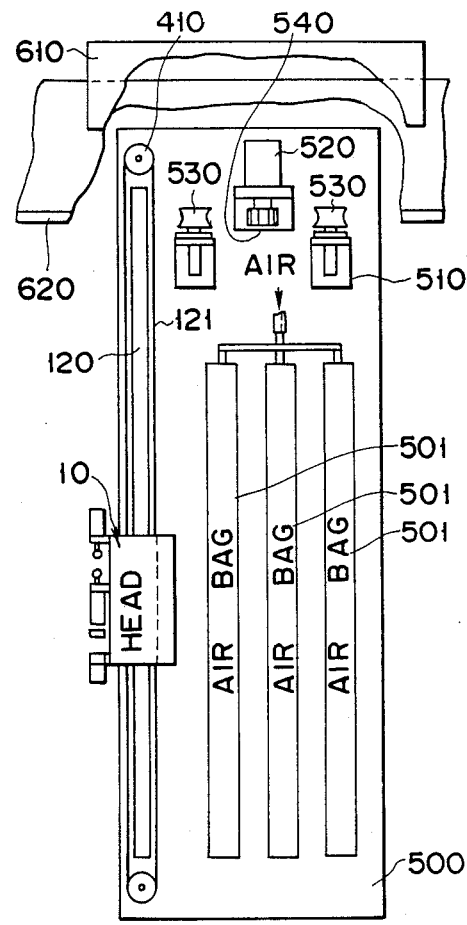
FIG. 46  FIG. 45
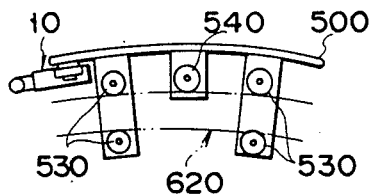
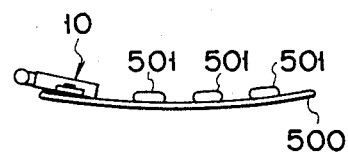
FIG. 48  FIG. 47

METHOD AND APPARATUS FOR MEASURING WEDGE

BACKGROUND OF THE INVENTION

1. Field of the Invention

The present invention relates to a method and apparatus for measuring a state of a coil-urging wedge arranged so that a coil inserted in a slot of a stator core of a revolving electric machine represented by a motor or generator can be prevented from extension in the radial direction of a rotor, while the rotor is kept inserted inside the stator.

2. Description of the Related Art

A typical revolving electric machine installed in a power plant is shown in FIG. 31. Revolving electric machine 1 comprises stator core (to be referred to as a core hereinafter) 5 having a plurality of slots 5a in the longitudinal direction (i.e., stacking direction Z), rotor 4 rotatably supported with predetermined gap 6 in the internal space of core 5, and stator coils (to be referred to as coils) 2 respectively inserted in slots 5a. As shown in FIGS. 32 and 33, wedges 3 (=3a and 3b) are inserted in each slot 5a from an axial end portion in the axial direction (Z) to prevent extension of coil 2 in the radial direction (X) from opening 5al formed in a stator wall of slot 5a at a position opposite to rotor 4.

FIGS. 32 and 33 are respectively cross-sectional and longitudinal sectional views for explaining a relationship between slot 5a and wedges 3. As shown in FIG. 33, wedges 3 comprise two kinds of wedges 3a and 3b. Wedges 3a and 3b are inserted alternately in the axial direction X, such that wedge 3a is inserted in slot 5a at a position close to opening 5al, while wedge 3b is inserted therein at a position far from opening 5al. Reference numeral 5b denotes a reaction force reception recess formed at the opening 5al side of each slot 5a. Both end portions of wedge 3a are inserted into recess 5b under pressure. Reference symbol F denotes a coil urging force by wedge fastening; and B, a deflection amount of a wedge when the wedge is urged against the coil.

With the above arrangement, there is a first method of performing a post-assembly test of a coil-urging state of the wedges since a sufficient deflection amount (coil urging force F) is applied to wedge 3a during assembly of the revolving electric machine. According to the first method, when a revolving electric machine is kept operated without inspections for a long period of time, an urging force of wedge 3a against coil 2 is weakened due to some reason, and coil 2 extends from slot 5a and abuts against rotor 4 to cause a decisive accident, i.e., a failure of the revolving electric machine.

In view of the above circumstances, conventionally, a second method has been adopted. According to the second method, a coil-urging state of the wedge is manually inspected by maintenance and inspection personnel periodically, e.g., every several years, by stopping the operation of the revolving electric machine.

In the first method, since the coil-urging state of the wedge is not inspected, reliability for stably supplying power tends to be degraded.

The second method poses the following problem. If a revolving electric machine has a rotor diameter of, e.g., 1,000 mm, a minimum gap between the stator and the rotor is as small as about 15 mm. For this reason, in order to inspect the coil-urging state of wedges 3, after the rotor is removed from the stator, the maintenance and inspection personnel must enter inside the stator and visually check wedges 3 or performs hammering to judge the coil-urging state of wedges 3 by listening to an echo. An inspection operation of wedges 3 by the maintenance and inspection personnel is cumbersome and requires considerable time from the beginning of inspection to its end. In addition, the maintenance and inspection personnel visually checks the wedges or listen to a striking sound or its echo upon hammering. Therefore, the state of wedges 3 which urge coil 2 cannot be objectively judged.

SUMMARY OF THE INVENTION

It is an object of the present invention to provide an easy, accurate method and apparatus for detecting a coil-urging state of wedges within a short period of time.

In order to achieve the above object, there is provided a wedge measuring apparatus comprising a measuring head, capable of being inserted between a stator and a rotor of a revolving electric machine, for testing a coil-urging state of wedges inserted in a slot, and a mechanism for moving the measuring head in the longitudinal direction (axial direction Z) of the stator and the circumferential direction of the rotor. A test for the coil-urging state is performed to prevent a coil (2) from extending from an opening (5al) in the radial direction (X). In this case, the coil (2) is inserted in a slot (5a) having the opening (5al) formed in a stator wall surface opposite to the rotor, and the slots (5a) are formed along the axial direction (Z) of the stator core.

With the above arrangement, the coil-urging state of the wedges can be easily and accurately tested without removing the rotor from the stator within a short period of time.

BRIEF DESCRIPTION OF THE DRAWINGS

FIG. 1 is a perspective view of a wedge measuring apparatus according to a first embodiment of the present invention;

FIG. 2 is a sectional view showing a state in which a measuring head of the wedge measuring apparatus is inserted in a gap between a rotor and a stator of a revolving electric machine;

FIG. 11 is a perspective view showing an arrangement of a measuring head for optically measuring "deflection" of a wedge in a noncontact manner;

FIG. 12 is a view for explaining the principle of operation of a measuring head shown in FIG. 11;

FIG. 21 is a perspective view of a wedge measuring apparatus according to a second embodiment of the present invention;

FIG. 29 is a partial perspective view showing the main part of a wedge measuring apparatus according to a third embodiment of the present invention;

FIG. 30 is a sectional view showing a state in which an air bag used in the embodiment of FIG. 29 is inflated;

FIG. 31 is a schematic perspective view showing an arrangement of a revolving electric machine measured by the wedge measuring apparatus of the present invention;

FIG. 32 is a cross-sectional view showing wedges driven in a stator core slot of the revolving electric machine shown in FIG. 31;

FIG. 33 is a longitudinal sectional view showing the wedges driven in the stator core slot of the revolving electric machine shown in FIG. 31;

FIG. 35 is a block diagram showing a basic arrangement of hardware for vibration-analyzing a slackened state of the wedge by using the measuring head shown in FIG. 34;

FIG. 36 is a block diagram for explaining operations of vibration analysis of the hardware shown in FIG. 35;

FIG. 42 is a schematic sectional view showing an arrangement of a hydraulic turbine generator which has a vertical rotating shaft and into which the wedge measuring apparatus of the present invention is inserted;

FIG. 45 is a plan view showing a wedge measuring apparatus which is inserted in the gap between the rotor and the stator of the hydraulic turbine generator in FIG. 42 according to a fifth embodiment of the present invention;

FIG. 46 is a side view of the wedge measuring apparatus shown in FIG. 45;

FIG. 47 is a bottom view of the wedge measuring apparatus shown in FIG. 45; and

FIG. 48 is a plan view of the wedge measuring apparatus shown in FIG. 45.

DETAILED DESCRIPTION OF THE PREFERRED EMBODIMENTS

Figure 3:
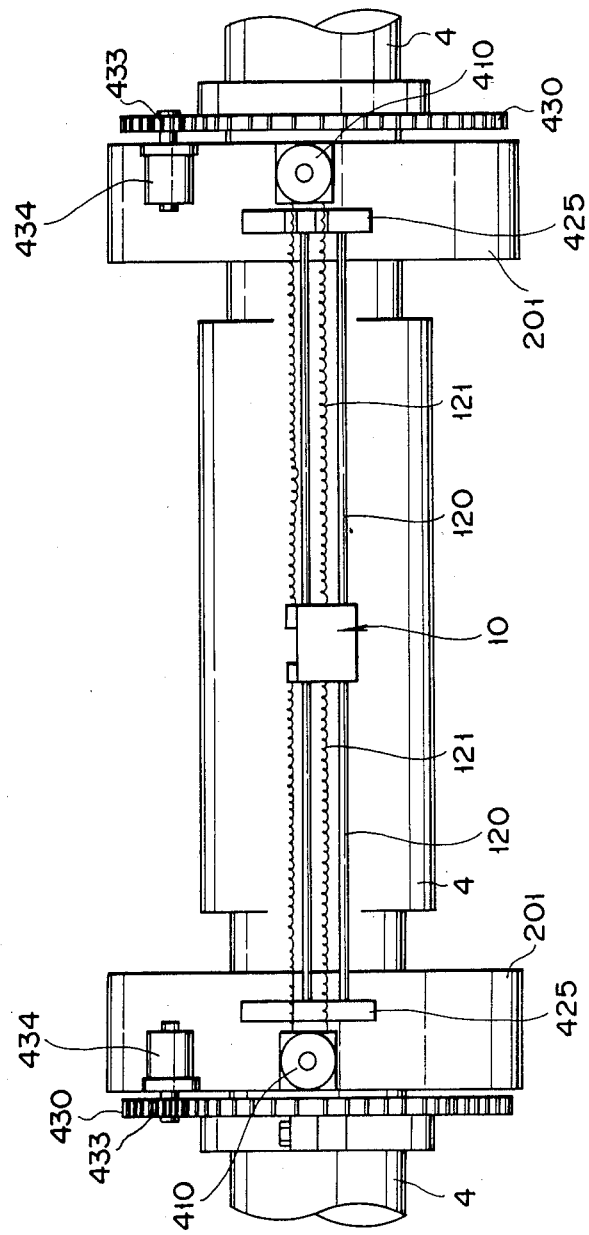
FIG. 3 is a partial enlarged top view of the measuring head in FIG. 2.

Preferred embodiments of the present invention will be described in detail below. FIG. 1 is a schematic perspective view of a wedge measuring apparatus according to a first embodiment of the present invention. FIG. 2 is a sectional view showing a state in which the wedge measuring apparatus shown in FIG. 1 is set in revolving electric machine 1. The wedge measuring apparatus can be inserted in gap 6 between core 5 and rotor 4. The wedge measuring apparatus comprises measuring head 10 for testing a coil-urging state of wedges 3, shift mechanism 20 for moving measuring head 10 in the longitudinal direction of core 5 and the circumferential direction of the rotor, and controller 40 for controlling head 10 and mechanism 20.

Figure 4:
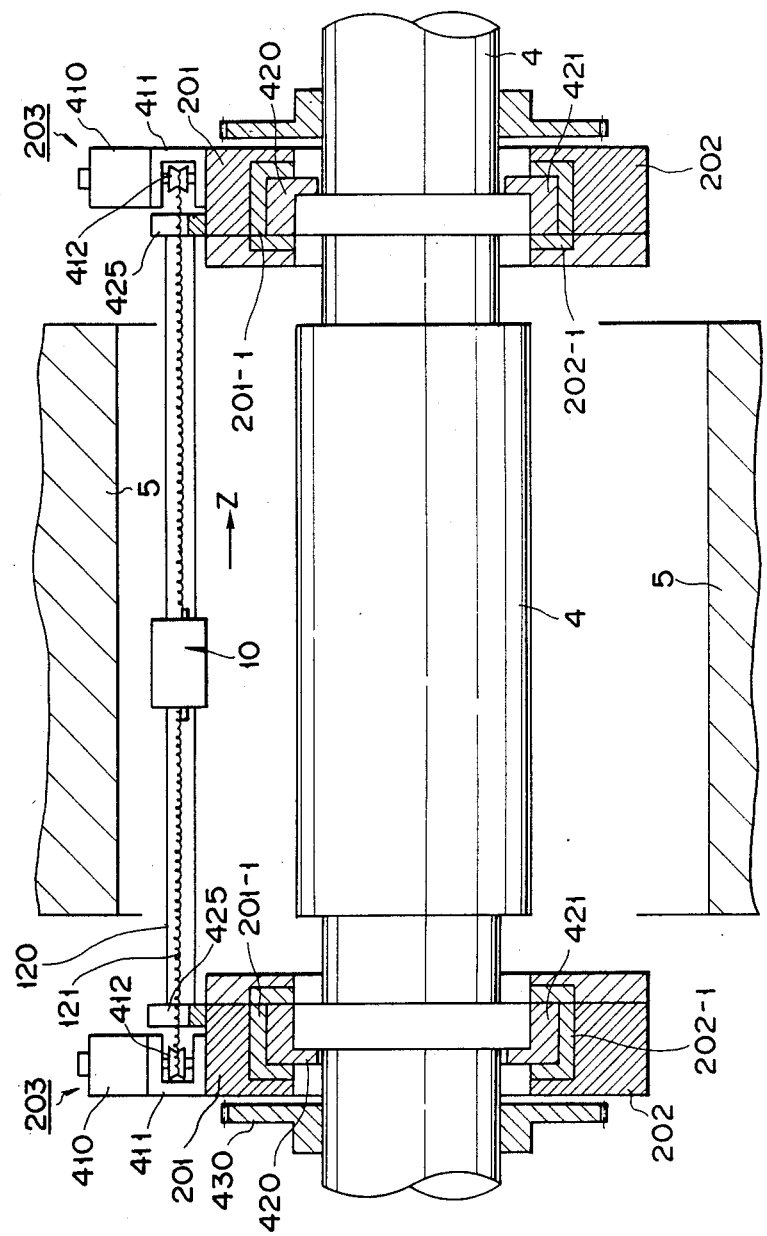
FIG. 4 is a partial enlarged side view of the measuring head in FIG. 2.
Figure 5:
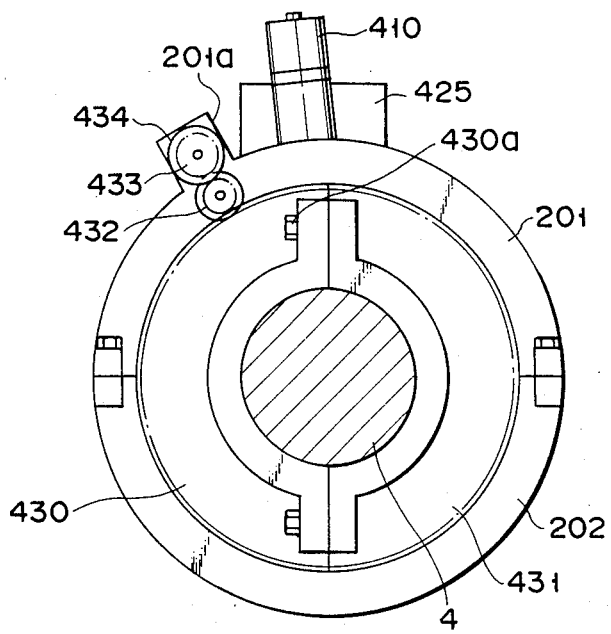
FIG. 5 is a partial enlarged view of the measuring head in FIG. 2 when viewed from a rotor shaft end portion.
Figure 6:
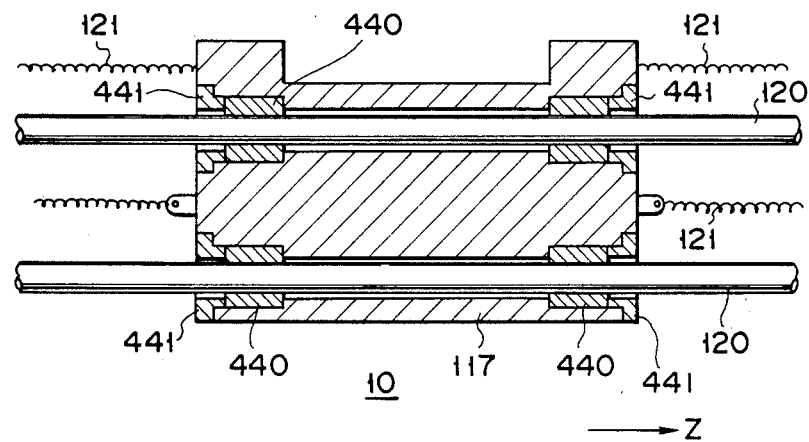
FIG. 6 is a sectional view showing how the measuring head in FIG. 3 is mounted on guide rails.

Moving mechanism 20 will be described with reference to FIGS. 3 to 6. FIG. 3 is an enlarged plan view of FIG. 1, and FIG. 4 is an enlarged sectional view of FIG. 2. FIG. 5 is a view of the shift mechanism viewed from a side in FIG. 4, and FIG. 6 is a sectional view showing a relationship between the measuring head and wires.

Moving mechanism 20 comprises guide rails 120, wires 121, semicircular guide rails 201 and 202, and drive mechanism 203. Two guide rails 120 extend through thin-plate frame 117 of measuring head 10 in FIG. 6 to movably support head 10 in longitudinal direction Z. Each guide rail 120 has a circular cross section and has a length larger than that of core 5. Frame 117 is reciprocated by wires 121. Circular guide rails each consisting of upper and lower semicircular guide rails 201 and 202 which can be separated from each other are mounted at both ends of rotor 4. Drive mechanisms 203 are mounted on both pairs of semicircular guide rails 201 and 201 to move measuring head 10 along linear guide rails 120 and move measuring head 10, guide rails 120, and wires 121 together in the circumferential direction of rotor 4.

Brackets 425 are mounted on the right and left upper semicircular guide rails 201 to support and fix corresponding guide rails 120, as shown in FIG. 4. Brackets 411 are respectively fixed near the brackets 425 to rotatably support pulleys 412 for driving wires 12 in axial direction Z. Longitudinal direction motors 410 are respectively mounted on brackets 411 to rotate pulleys 412 and apply a driving force to wires 121.

As is apparent from the above description, longitudinal direction motors 410 are mounted on right and left upper semicircular guide rails 201. This is because a power can be smoothly transmitted from shift mechanism 20 to measuring head 10 even if a distance between both upper semicircular guide rails 201 is long.

Upper semi-fixed rails 420 are respectively formed inside right and left upper semicircular guide rails 201 through slide metal members 201-1 mounted on rotor 4 so as to rotate guide rails 201 in the circumferential direction. Lower semi-fixed rails 421 are respectively formed inside right and left lower semicircular guide rails 202 through slide metal members 202-1 so as to rotate guide rails 202 in the circumferential direction.

Gear wheels 430 and 431 are mounted at each of both ends of the rotating shaft of rotor 4 during wedge deflection measurement. Gear wheels 430 and 431 can be coupled to the rotating shaft through nuts 430a.

Collars 201a for supporting rotation motors are formed at parts of the outer surfaces of right and left upper semicircular guide rails 201, respectively, as shown in FIG. 5. Rotation motors 434 are mounted on collars 201a, respectively. Drive gears 433 are mounted on rotating shafts of rotation motors 434, respectively. Idler gears 432 serving as planetary gears are meshed between drive gears 433 and gear wheels 430 and 431.

Two bearings 440 are fitted in a sliding portion of frame 117 and each guide rail 120 so as to allow free movement of frame 117 of measuring head 10 along guide rails 120, as shown in FIG. 6. Bearing stoppers 441 are fitted in frame 117 to prevent bearings 440 from being removed therefrom.

An operation of shift mechanism 20 having the above arrangement will be described below. In order to move measuring head 10 along the longitudinal direction, longitudinal direction motors 410 are driven by controller 40 shown in FIG. 1. Upon rotation of motors 410, pulleys 412 supported on the rotating shafts of motors 410 are rotated, so that wires 121 are moved between pulleys 412. In this case, since longitudinal direction motor 410 are mounted on right and left upper semicircular guide rails 201, smooth driving can be achieved even if a moving distance of measuring head 10 is long.

When measuring head 10 is rotated in the circumferential direction of rotor 4, rotation motors 434 are driven by controller 40. Upon rotation of drive gears 433 rotatably supported on collars 201a of upper semicircular guide rails 201, idler gears 432 orbit around gear wheels 430 and 431. Upper and lower semicircular guide rails 201 and 202 are rotated in the circumferential direction. Therefore, measuring head 10 supported by guide rails 120 between upper and lower semicircular guide rails 201 and 202 can be moved in the circumferential direction. In this case, since rotation motors 434 are mounted on collars 201a of right and left upper semicircular guide rails 201, measuring head 10 can be smoothly driven even if a moving distance of head 10 is long.

FIG. 11 is a perspective view showing a first arrangement of measuring head 10. FIG. 12 is a view for explaining the principle of measurement by head 10 shown in FIG. 11.

Component mounting recess 118 is formed at the central position of the upper surface of frame 117. Component mounting recess 118 stores: light projectors 101 to 103 each consisting of light-emitting element PD and lens L1 to emit measuring light; mirrors 104, 105, and 106 for changing an optical path of measuring light from light projectors 101 to 103 toward a direction of wedges 3 within slit 5a of core 5; mirrors 110, 111, and 112, located at positions to form a triangle for a distance measurement with mirrors 104 to 106 according to the principle of triangulation, for reflecting light reflected by light spots 107, 108, and 109 formed on the surface of wedges 3 (3a and 3b) upon incidence of light reflected by mirrors 104 to 106, thereby guiding light to light-receiving devices 113, 114, and 115; light-receiving devices 113, 114, and 115 each consisting of lens L2 and light-receiving element PT to detect light reflected by a corresponding one of mirrors 110 to 112 and output an optical signal; and a vibrator such as solenoid 116 for vibrating a wedge surface of interest.

One end of an image fiber (IMF in FIG. 1) for, e.g., an industrial television camera is connected to measuring head 10. The other end of the image fiber is connected to an industrial television camera (not shown) installed in controller 40. The positions of the slots of the revolving electric machine, and the positions of wedges 3 can be monitored on a monitor CRT in FIG. 1. Note that a video signal cable is used in place of the image fiber when a micro CCD imager which can be inserted in gap 6 of the revolving electric machine can be mounted on measuring head 10.

Figure 7:
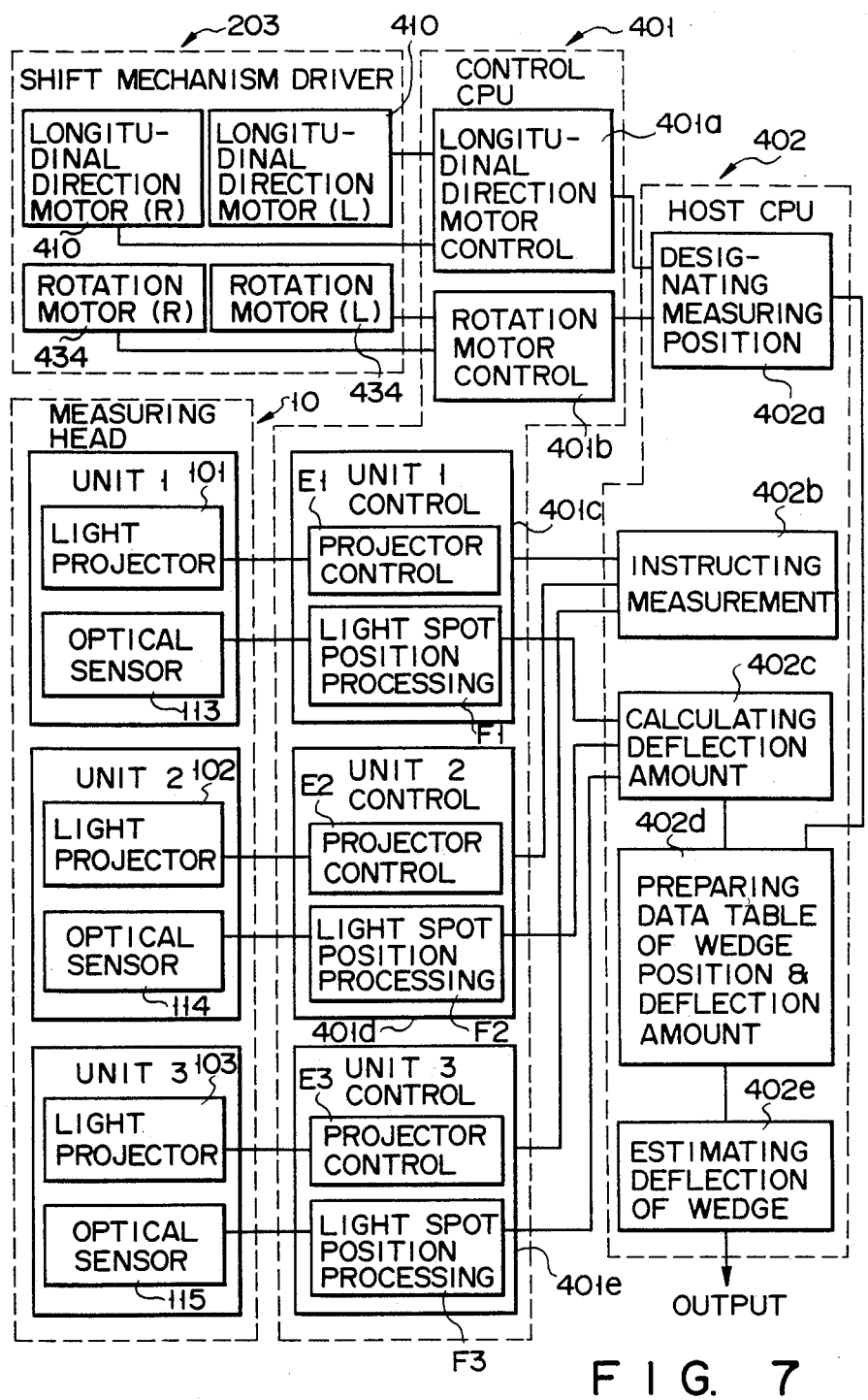
FIG. 7 is a block diagram showing an arrangement of a controller of the wedge measuring apparatus for optically measuring "deflection" of a wedge.

FIG. 7 is a block diagram showing an electrical circuit of optical measuring head 10, shift mechanism 20, and controller 40. An ON/OFF command signal from projector control section E1 in unit 1 control 401c is input to projector 101 in unit 1 incorporated in measuring head 10. A light reception signal from light-receiving device 113 in unit 1 is input to light spot position processing section F1 in unit 1 control section 401c.

Similarly, an ON/OFF command signal from projector control section E2 in unit 2 control 401d is input to projector 102 in unit 2. A light reception signal from light-receiving device 114 is input to light spot position processing section F2 in unit 2 control 401d. An ON/OFF command signal from projection control section E3 in unit 3 control 401e is input to projector 103 in unit 3. A light reception signal from light-receiving device 115 in unit 3 is input to light spot position processing section F3 in unit 3 control 401e.

Motor drive control signals are input from longitudinal direction motor control 401a included in control CPU 401 are input to right and left longitudinal direction motors 410 incorporated in shift mechanism driver 203 in shift mechanism 20. Motor drive signals are input from rotation motor control 401b included in control CPU 401 to right and left rotation motors 434 of shift mechanism driver 203. A signal which designates shift of measuring head 10 to a specific position is supplied from section 402a for designating measuring position included in host CPU 402 to longitudinal direction motor control 401a and rotation motor control 401b.

A signal representing start of testing of wedges 3 is input from section 402b for instructing measurement included in host CPU 402 to unit controls 401c, 401d, and 401e.

Output signals from light spot position processing sections F1 to F3 are input to section 402c for calculating deflection amount included in host CPU 402. An output signal from section 402c for calculating deflection amount which represents a deflection amount of wedge 3 and a signal representing the position of measuring head 10 and output from section 402a for designating measuring position are input to section 402d for preparing data table of wedge position and deflection amount (data table 402d). Output signals of data arranged in data table 402d are input to section 402e for estimating deflection of wedge.

Figure 8:
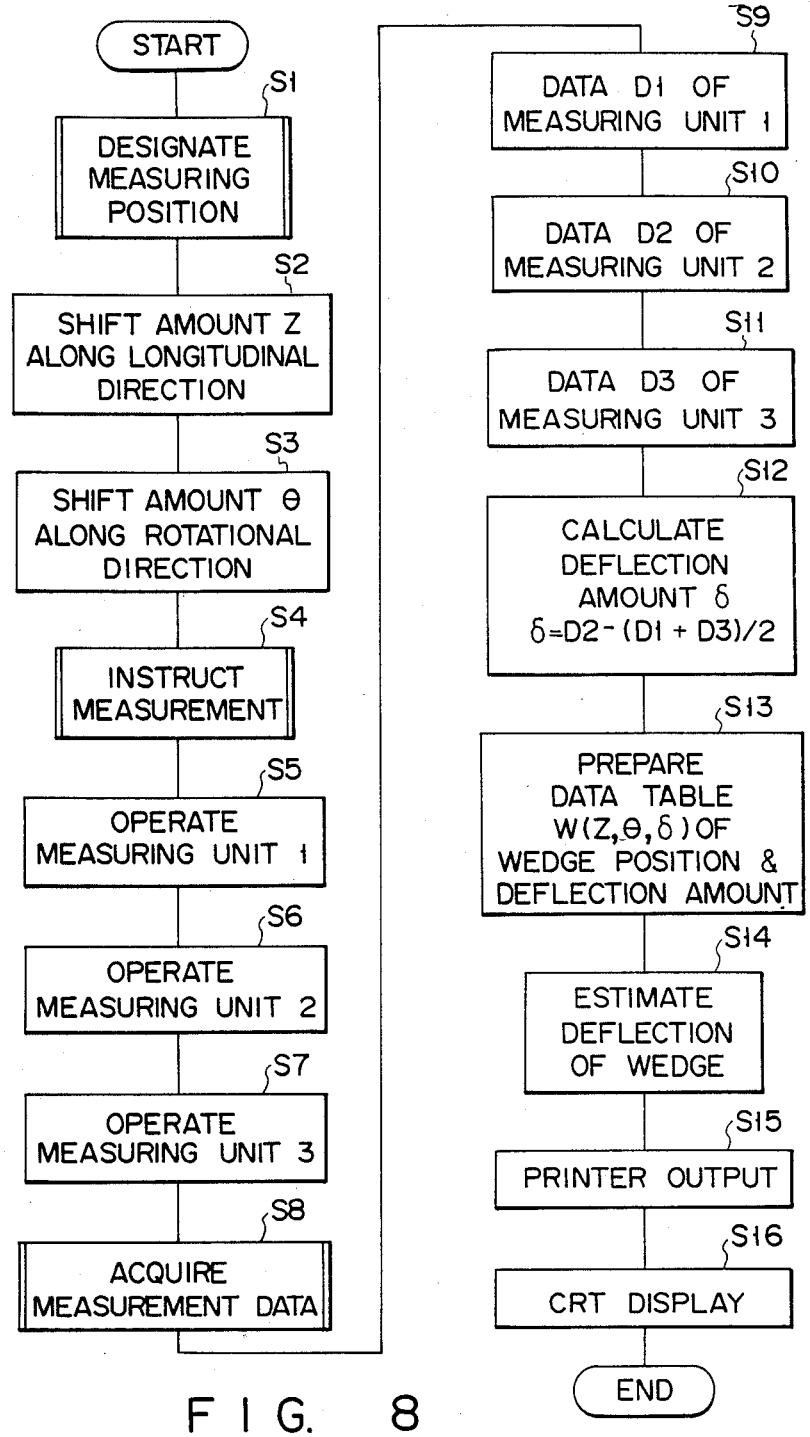
FIG. 8 is a flow chart for explaining an operation of a host computer in the controller shown in FIG. 7.

A processing operation in host CPU 402 in FIG. 7 is shown in a flow chart in FIG. 8. In step S1, a designation signal is supplied from section 402a for designating measuring position to longitudinal direction motor control 401a and rotation motor control 401b. In this state, longitudinal direction motors 410 and rotation motors 434 are rotated in accordance with a content of the input designation signal. In steps S2 and S3, measuring head 10 is moved by shift amounts Z and $\theta$, respectively, along the longitudinal and rotational directions. When a measurement is instructed in step S4, measuring units 1, 2, and 3 are operated in steps S5, S6, and S7, respectively.

More specifically, when a command is supplied from section 402b for instructing measurement to controls 401c, 401d, and 401e, projectors 101 to 103 emit light. In step S8, light reception signals, i.e., measurement data, from light-receiving devices 113 to 115 are acquired. Data D1 to D3 of measuring units 1 to 3 calculated in steps S9, S10, and S11 by light spot position processing sections F1 to F3 are input to section 402c for calculating deflection amount. Deflection amount $\delta$ is calculated in step S12 as follows:

$$\delta = D2 - (D1 + D3)/2 \quad (1)$$

Deflection amount $\delta$ calculated by section 402c for calculating deflection amount and a measuring head position designation signal from section 402a for designation measuring position are input to data table 402d. In step S13, deflection data $W(Z, \theta, \delta)$ is formed. This deflection data is input to section 402e for estimating deflection of wedge. In step S14, the deflection amount of the wedge is estimated. An estimated result is output to a printer in step S15 or displayed on a CRT in step S16. Note that host CPU 402 in FIG. 7 can be a personal computer or an engineering workstation which is programmed to execute procedures in FIG. 8.

The principle of measurement of measuring head 10 will be described with reference to FIG. 12. More specifically, as shown in FIG. 12, when measuring light from projector 101 is reflected by mirror 110, light spot 107 is formed on a surface of wedge 3 of interest. Part of reflected light of light spot 107 is reflected by mirror 110, and the reflected component is focused on the surface of light-receiving element PT through lens L2 in light-receiving device 113. A focusing state varies depending on a distance to wedge 3. The position of wedge 3 can be measured on the basis of this change. That is, when wedge 3 is located at a position far from or close to a reference position, an electric output signal from light-receiving device 113 is weakened, thereby determining whether wedge 3 is located at the reference position. Therefore, a state of wedge 3 which urges against coil 2 can be detected.

In the operational description of the above embodiment, light-receiving device 113 receives measuring light from projector 101. A relative position of wedge 3 can be detected by utilizing one of remaining projectors 102 and 103 and a corresponding one of remaining light-receiving devices 114 and 115. Therefore, a state of one wedge 3 which urges the coil can be detected at three different positions of this wedge.

The wedge measuring apparatus based on the above principle can be set as follows while rotor 4 is kept assembled in core 5, as shown in FIGS. 2 and 4. More specifically, one-side components of shift mechanism 20, e.g., right circular guide rails 201 and 202 and shift mechanism driver 203, are temporarily removed from linear rail 120 and wire 121. In this state, measuring head 10 is inserted in gap 6 between core 5 and rotor 4 from the right side in FIG. 4. Circular guide rails 201 and 202 on the other side (left side in FIG. 4) of shift mechanism 20 are disassembled, and they are mounted on the rotating shaft of rotor 4. Right circular guide rails 201 and 203, right shift mechanism driver 203, right linear guide rail 120, and right cable 121, all of which are temporarily removed, are assembled and the resultant wedge measuring apparatus is set in revolving electric machine 1.

In this state, measuring head 10 is located at an end of, e.g., a predetermined slot. This positioning can be achieved by an operation on a keyboard connected to controller 40 so as to drive shift mechanism driver 203. Head 10 is then set at the predetermined position while the slot number and the position of wedge 3 are confirmed with the television camera in controller 40, thereby measuring a state of wedge 3 which urges coil 2. Measuring head 10 is then moved along slot 5a to sequentially check wedges 3 located within this slot 5a.

When all wedges 3 located in one slot 5a are checked, shift mechanism 20 is operated as described above. Guide rails 120, wires 121, and shift mechanism drivers 203 together with measuring head 10 are rotated by shift mechanism drivers 203 along the circumferential direction of the circular guide rails. Measuring head 10 is then located at the next slot 5a adjacent to the slot subjected to the immediately preceding measurement. A state of wedge 3 which is urged within this slot 5a is tested. The above operations are repeated for all wedges 3 in all slots 5a formed in core 5.

The measurement results are stored in a recording device such as a floppy disk drive connected to controller 40. If a failure is found in the states of wedges 3 by observing the stored results of the recording device, rotor 4 is removed from core 5 after measurements of all wedges 3. Failed wedges 3 are replaced with new wedges 3 having a larger thickness, thereby increasing deflection amounts of wedges (B in FIG. 33), thereby restoring a normal coil-urging state of the wedge.

Measuring head 10 in FIG. 11 can perform distance measurement using a principle except for the triangulation principle. More specifically, when a solenoid actuator is arranged in head 10, this actuator is brought into contact with wedge 3 to be measured, so that this wedge 3 can be vibrated. A vibration frequency and amplitude of this wedge are measured by a vibration measuring device, thereby testing a coilurging state of wedge 3.

An operation based on the above principle will be described with reference to a block diagram of an electrical circuit in FIG. 9 and a flow chart representing processing operations in FIG. 10.

Figure 9:
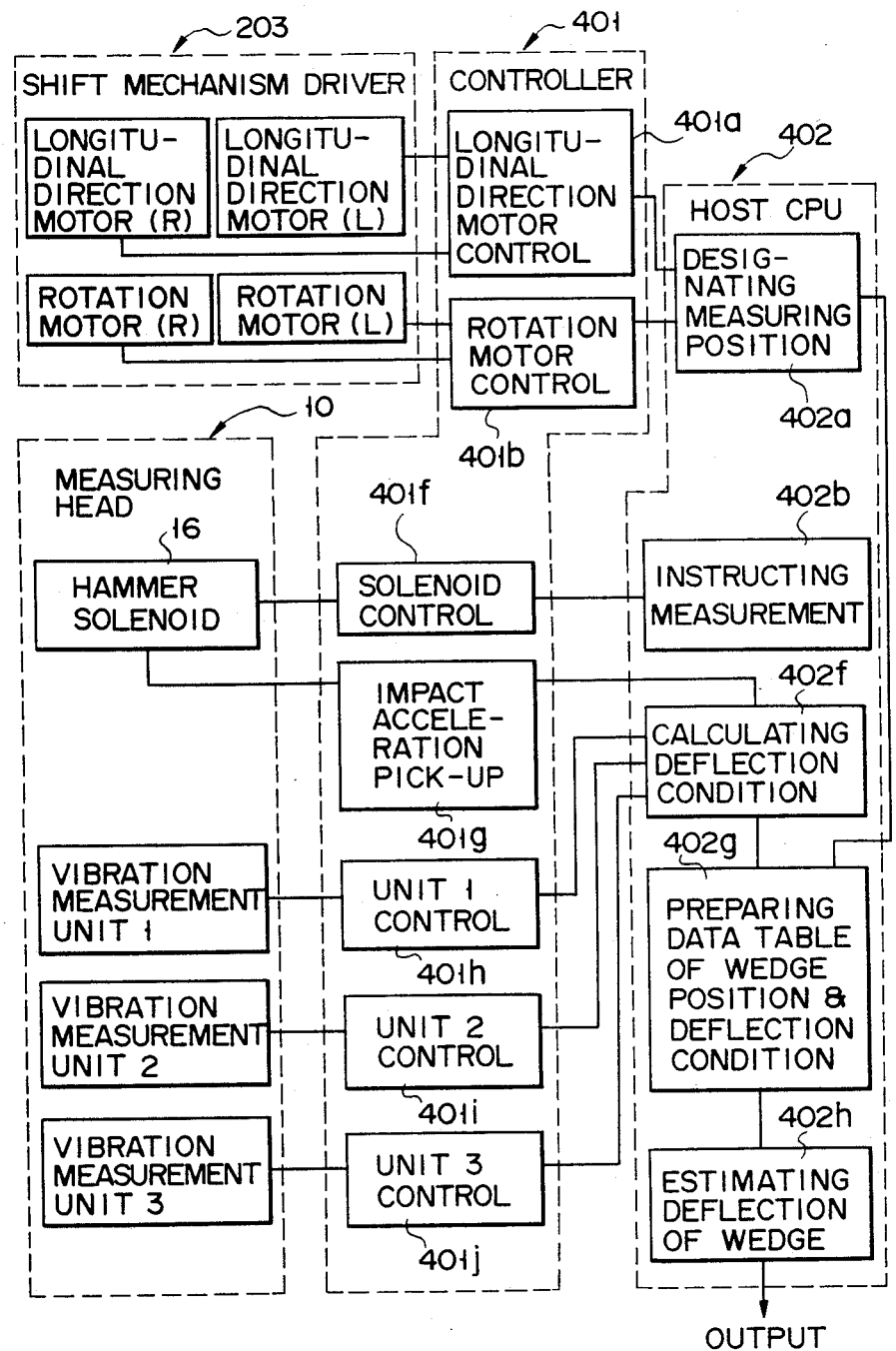
FIG. 9 is a block diagram showing an arrangement of a controller in the wedge measuring apparatus for measuring "deflection" of a wedge by vibration analysis.

FIG. 9 shows an arrangement using measuring head 10 comprising hammer solenoid 16 and vibration measurement units 1, 2, and 3 in place of measuring head 10 in FIG. 7. In this case, host CPU 402 comprises section 402a for designating measuring position, section 402b for instructing measurement, section 402f for calculating deflection condition, section 402g for preparing data table of wedge position & deflection condition (data table 402g), and section 402h for estimating deflection of wedge. Control CPU 401 includes solenoid control 401f, impact acceleration pick-up 401g, unit 1 control 401h, unit 2 control 401i, and unit 3 control 401j.

A measurement operation of the wedge measuring apparatus having the above arrangement will be performed as follows. Different parts of FIG. 9 from FIG. 8 will be described below. In step S24, hammer solenoid 16 supplies a designation signal from section 402b for instructing measurement to solenoid control 401f. In step S25, when solenoid 16 is operated, a pulse impact is applied from solenoid 16 to wedge 3. A maximum hammer acceleration is recorded by section 402g. Vibration measuring units 1, 2, and 3 detect vibration accelerations of wedge 3 in steps S26, S27, and S28. The detected acceleration data are acquired by section 402f through unit 1 control 401h, unit 2 control 401i, and unit 3 control 401j.

Data table 402g is used to calculate deflection amounts C on the basis of the acquired data in step S34. More specifically, deflection amounts C1, C2, and C3 are calculated using the acceleration data obtained in steps S30, S31, S32, and S33 in accordance with the following equations:

$$C1 = \overline{a1max}/asmax$$
$$C2 = a2max/asmax$$
$$C3 = a3max/asmax$$
(2)

Data table $V(Z, \theta, C1, C2, C3)$ of wedge position and deflection condition is prepared in step S35. Data table V is estimated by section 402h in step S36 to determine whether deflection values C are larger than the reference value. An estimation result is output to a printer in step S37 and displayed on a CRT in step S38.

Figure 10:
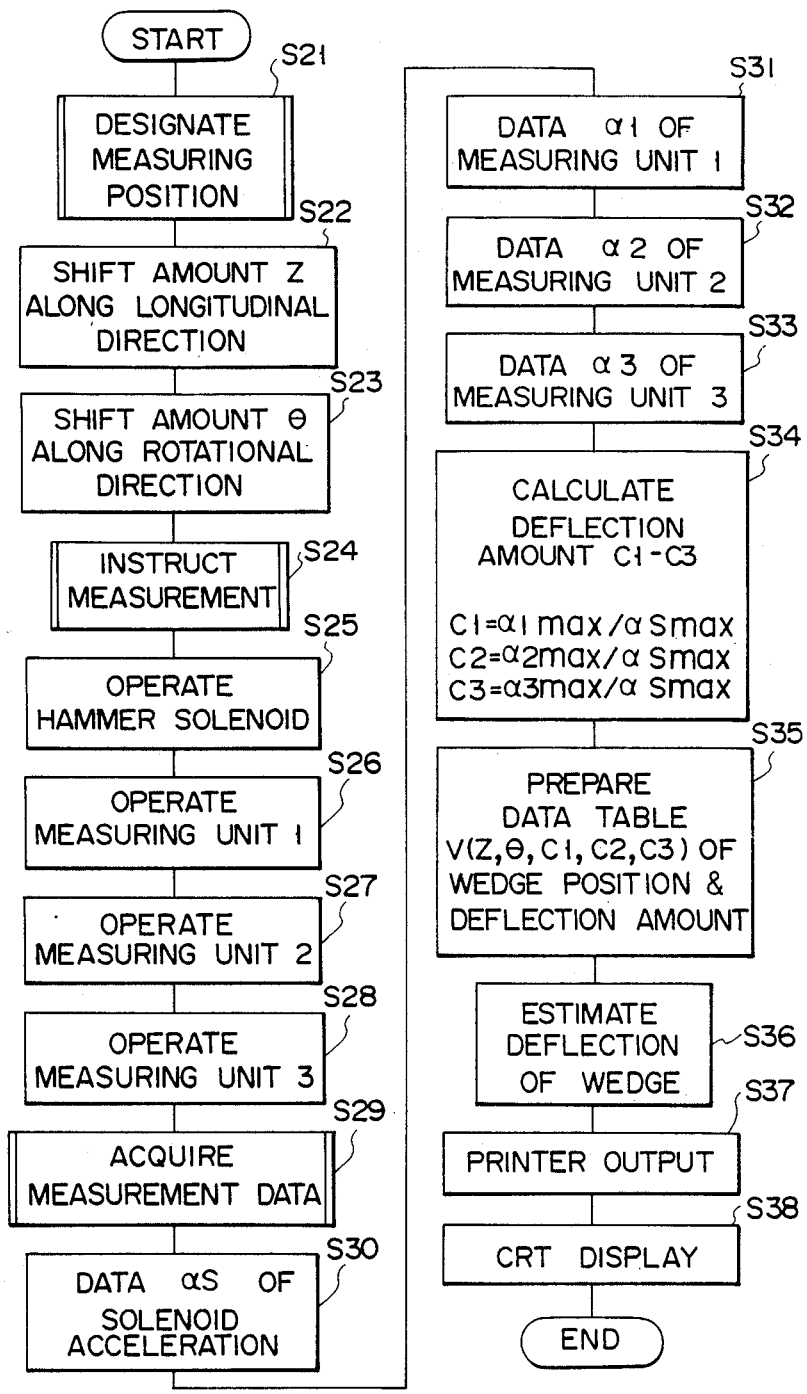
FIG. 10 is a flow chart for explaining an operation of a host computer in the controller shown in FIG. 7.

In FIGS. 9 and 10, when a coil-urging force of wedge 3 is small (i.e., deflection amount B in FIG. 33 is small), the vibration frequency is low and acceleration $\alpha$ in equations (2) becomes small. To the contrary, when a coil-urging force of wedge 3 is large (i.e., deflection amount B in FIG. 33 is large), the vibration frequency is high and acceleration $\alpha$ in equations (2) is larger. Therefore, a deflection condition of wedge 3 can be detected.

When a coil-urging state of wedge 3 is inspected, the measuring operation of each wedge 3 can be simplified as compared with a case wherein rotor 4 is removed from core 5, and maintenance and inspection personnel manually judge the coil-urging state of each wedge 3 by visual observation or by listening to a striking sound or its echo. Therefore, the measuring time can be greatly shortened, and high measuring accuracy can be obtained. Since measuring head 10 includes three projectors 104 to 106, light-receiving devices 113 to 115, mirrors 104 to 106, and mirrors 110 to 112, three sets of units are aligned with the wedge positions to simultaneously measure three wedges upon one shift operation of measuring head 10.

Figure 13:
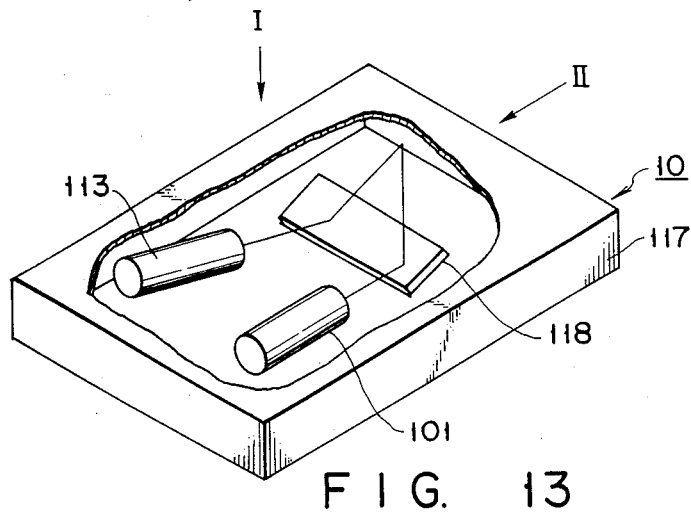
FIG. 13 is a perspective view showing another arrangement of a measuring head for optically measuring "deflection" of a wedge in a noncontact manner.
Figure 14:
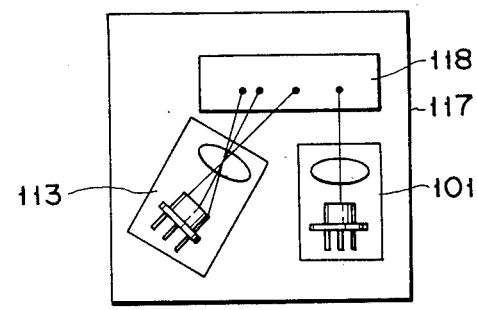
FIG. 14 is a plan view of a measuring head in FIG. 13 when viewed from the I direction.
Figure 15:
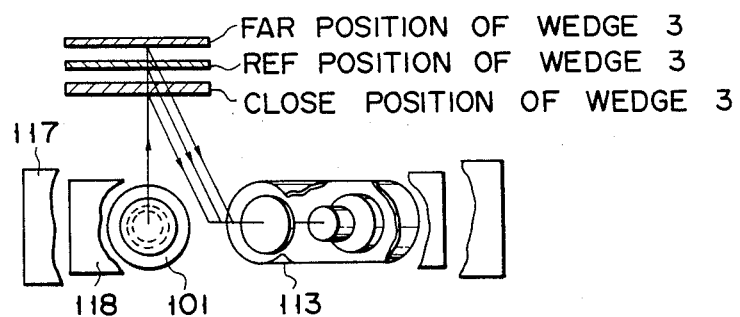
FIG. 15 is a plan view of the measuring head in FIG. 13 when viewed from the II direction.

FIG. 13 is a perspective view showing only the main part of a second arrangement of measuring head 10, FIG. 14 is a plan view thereof when viewed from the I direction of FIG. 13, and FIG. 15 is a side view thereof when viewed from the II direction of FIG. 13. In measuring head 10 in FIG. 11, projector 101 (102 or 103) opposes light-receiving device 113 (114 or 115) through mirrors 104 (105 or 106) and 113 (114 or 115). In the arrangement of FIG. 13, projector 101 and light-receiving device 113 are located on the same side with respect to mirror 118. In this case, the coil-urging state of wedge 3 can be detected in the same manner as in measuring head 10 in FIG. 11.

Figure 16:
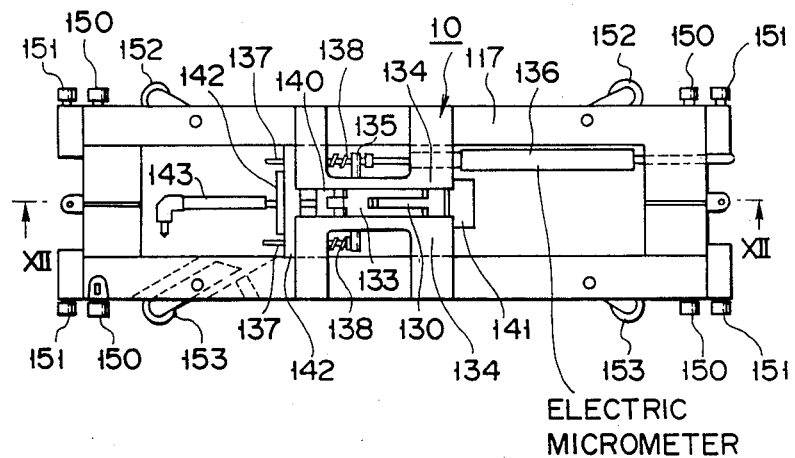
FIG. 16 is a plan view showing an arrangement of a measuring head for performing a contact measurement of "deflection" of a wedge by using an electric micrometer.
Figure 18:
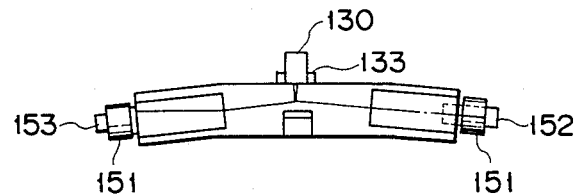
FIG. 18 is a side view of part of a contact measuring head in FIG. 16 when viewed from the right in FIG. 16.
Figure 20:
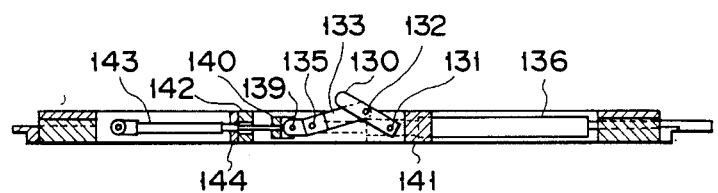
FIG. 20 is a view of the contact measuring head when the section along the line XII—XII is viewed from the lower surface in FIG. 16.

FIG. 16 is a plan view of a third arrangement of measuring head 10, FIG. 18 is a right side view thereof, FIG. 10 is a front view thereof, and FIG. 20 is a sectional view thereof along the line XII—XII in FIG. 16. Heads 10 in FIGS. 11 and 13 are optical heads. However, measuring head 10 in FIG. 16 has an arrangement wherein a link mechanism is combined with a contact distance measuring device to measure a radial displacement within a narrow gap.

Measuring head 10 in FIG. 16 comprises: probe 130 which is brought into contact with wedge 3 which has a surface to be measured; link 133 connected to an intermediate portion of probe 130 through coupling pin 132; guide frames 134 for smoothly and movably supporting probe 130 and link 133; slide pin 135 slidable along a groove (not shown) formed in guide frames 134 fixed at the intermediate portion of link 133; electric micrometer 136 which is brought into contact with pin 135 and reciprocated to record a forward or backward displacement; rods 137 opposite to electric micrometer 136 through slide pin 135; compression coil springs 138 set between a collar of slide pin 135 on rods 137 and guide frames 134 to apply an upward force to probe 130 through rods 137; coupling pin 139 fixed to the lower end of link 133; hinge 140 rotatably connected to coupling pin 139; press plates 141 and 142 for keeping a distance between right and left guide frames 134 constant; air cylinder 143 for applying a force larger than that of compression coil springs 138 to hinge 140 to pull probe 130 to a level at which probe 130 does not appear from the upper surfaces of frames 117; travel rollers 150 mounted on outer sides of frames 117; tension rollers 151; lateral fixing rollers 152; and lateral tension rollers 153.

Measuring head 10 having the third arrangement as described above can be used as follows. Air cylinder 143 is operated to allow head 10 having probe 130 stored in frames 117 to pass through an inlet of gap 6 between rotor 4 and core 5 in FIG. 2. When wedge 3 inside core 5 is to be measured, air cylinder 143 is released. Probe 130 can then be moved upward by the biasing forces of compression coil springs 138 until it is brought into contact with wedge 3 as an object to be measured. This position is calculated based on a value from electric micrometer 136.

Figure 17:
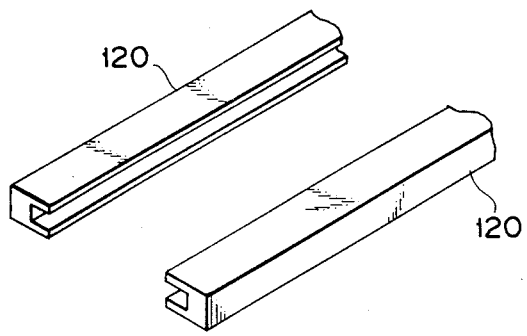
FIG. 17 is a perspective view showing a modification of the guide rails shown in FIG. 6.
Figure 19:
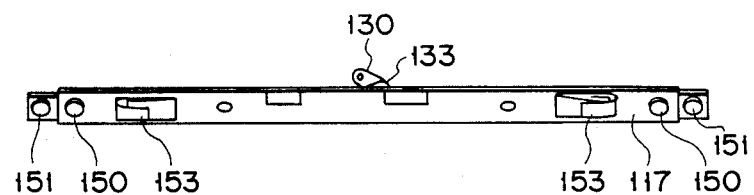
FIG. 19 is a front view of part of the contact measuring head in FIG. 16 when viewed from the lower surface in FIG. 16.

FIG. 17 is a perspective view showing a modification of guide rails 120. Each guide rail 120 described with reference to FIG. 1 has a circular cross section. However, each guide rail in FIG. 17 has a channel shape (i.e., U-shaped cross section). In this case, measuring head 10 must have travel rollers 150, tension rollers 151, lateral fixing rollers 152, and lateral tension rollers 153, as shown in FIGS. 16, 18, and 19. Longitudinal linear guide rails 120 are not limited to those described above. A guide rail may have an arcuated cross section to prevent deflection of the rail itself.

Figure 22:
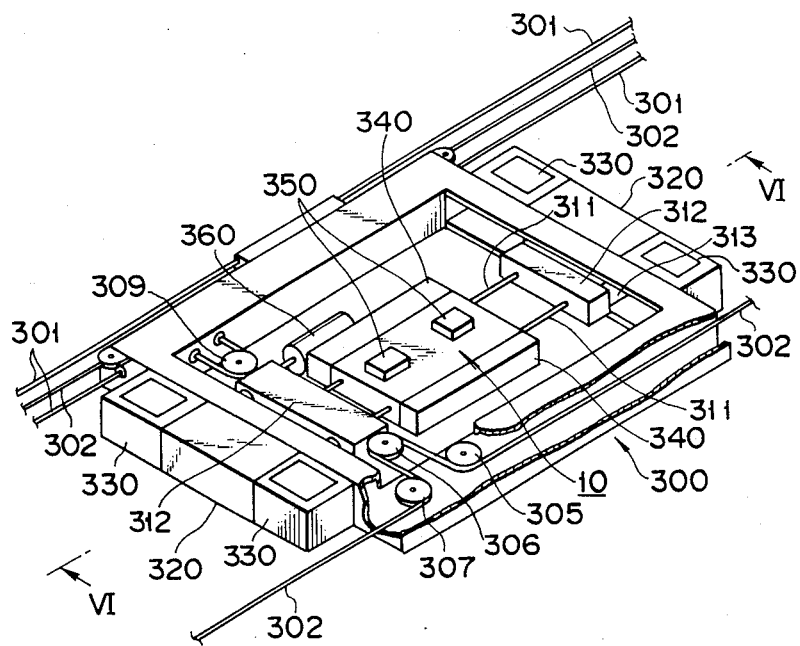
FIG. 22 is an enlarged perspective view of a measuring head in FIG. 21.
Figure 23:
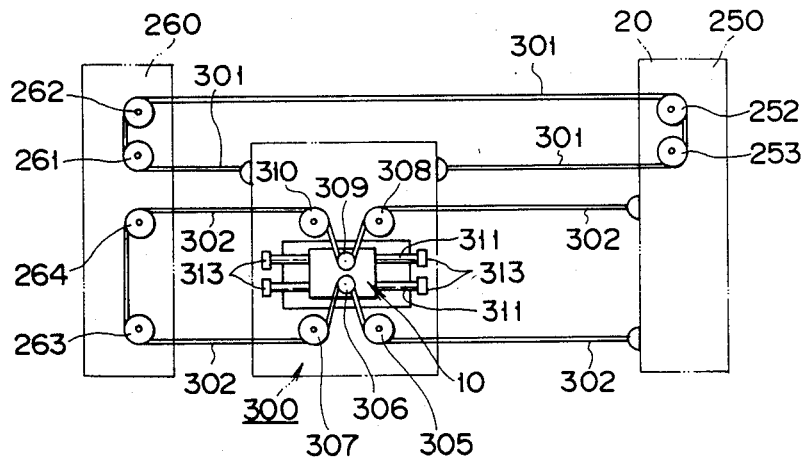
FIG. 23 is a view showing a wiring of a mechanism for moving the measuring head in FIG. 21.
Figure 24:
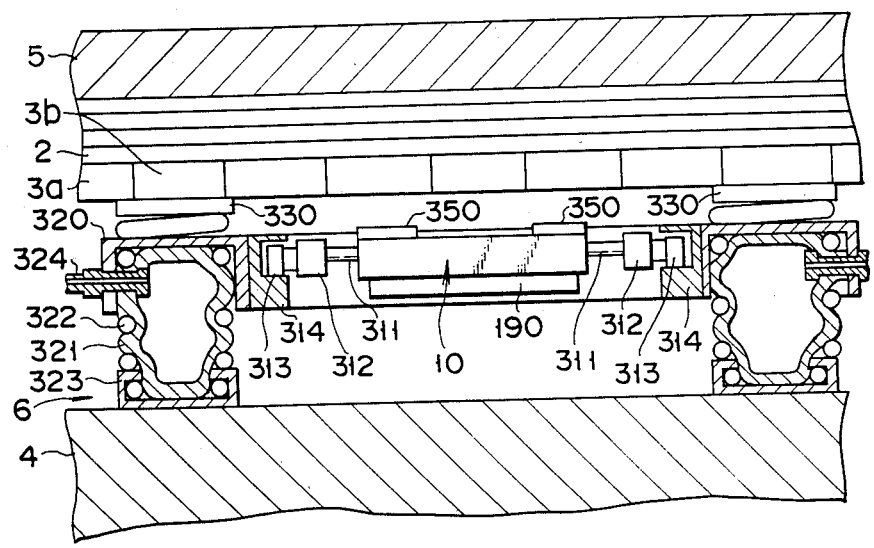
FIG. 24 is a sectional view showing a state wherein the measuring head in FIG. 22 is temporarily fixed in a gap between a rotor and a stator of a revolving electric machine.

FIG. 21 is a perspective view showing a wedge measuring apparatus according to a second embodiment of the present invention, FIG. 22 is a perspective view showing a peripheral arrangement of measuring head 10 shown in FIG. 21, FIG. 23 is a plan view showing a relationship between wires 301 and 302 in FIG. 22, and FIG. 24 is a sectional view along lines VI—VI of a state wherein measuring head 10 in FIG. 22 is set in a revolving electric machine. This embodiment includes stepping mechanism 300 for stepping and holding head 10 in gap 6 between rotor 4 and core 5 of revolving electric machine 1. In order to drive stepping mechanism 300, stepping mechanism drivers 250 and 260 can be pivoted about circular guide rails consisting of upper and lower semicircular guide rails 201 and 202. By using these drivers, a thrust is applied to stepping mechanism 300 while wires 301 and 302 are kept taut.

The wedge measuring apparatus shown in FIGS. 21 to 23 will be described blow. The wedge measuring apparatus comprises: wires 301 fixed to both ends of stepping mechanism 300 in the longitudinal direction (stepping direction) of stepping mechanism 300; pulleys 252 and 253 arranged at each end of driver 250 to support wires 301; pulley 261 and driving pulley 262 which are arranged in driver 260; wires 302 having both ends fixed to driver 250; pulleys 305 and 307 and pulleys 308 and 310 arranged in stepping mechanism 300 to support wires 302, respectively; pulleys 306 and 310 arranged in measuring head 10 to apply tensional forces to wires 302, respectively; pulley 263 and driving pulley 264 which are arranged in driver 260; guides 311 for movably supporting measuring head 10 in the longitudinal direction of stepping mechanism 300; guide frames 312 constituting end portions of guides 311 to support measuring head 10 in stepping mechanism 300 in a direction perpendicular to the longitudinal direction; guide rails 314 for rollers 313 mounted on guide frames 312; urging mechanisms 320 incorporated in stepping mechanism 300 to urge against roller 4 and core 5; urging mechanisms 330 urging against core 5; urging mechanisms 340 incorporated in measuring head 10 to urge against rotor 4 and core 5; abutment surfaces 350 which abut against core 5 and serve as a measuring reference; air bags 321 constituting urging mechanisms 320, 330, and 340; compression coil springs 322 for flexibly supporting air bags 321; press plates 323; nozzles 324 for supplying air to or exhausting it from air bags 321; and air cylinder 360 for positioning measuring head 10 with respect to guide frames 312.

Figure 25A:
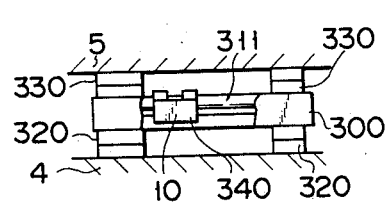
FIGS. 25A, 25B and 26 to 28 are views for explaining an operation of the measuring head shown in FIG. 24.
Figure 25B:
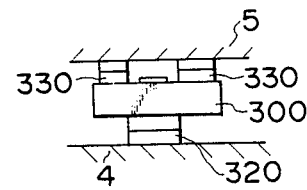

An operation of the wedge measuring apparatus having the arrangement shown in FIG. 22 will be described with reference to FIGS. 25A to 28. FIG. 25A is a front view of the apparatus shown in FIG. 22, FIG. 25B is a side view thereof in FIG. 22, and FIGS. 26 to 28 are plan views of the apparatus in FIG. 22.

Figure 26:
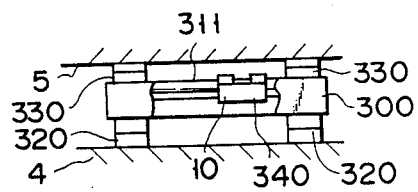
Figure 27:
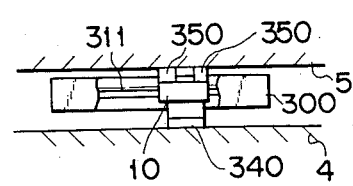

Measuring head 10 is moved along guides 311 in the longitudinal direction and is rotated in the circumferential direction by using urging mechanisms 320, 330, and 340 and the abutment surfaces. As shown in FIGS. 25A and 25B, when urging mechanisms 320 and 330 are extended while urging mechanisms 340 contract, measuring head 10 can be freely moved. For example, as shown in FIG. 26, when the piston having cylinder 360 is extended, measuring head 10 is moved in the longitudinal direction. Referring to FIG. 27, urging mechanisms 320 and 330 contract while extension is performed using urging mechanisms 340 and abutment surfaces 350. The piston of cylinder 360 contracts in FIG. 28, and stepping mechanism 300 is moved in the longitudinal direction. The above operations are repeated to freely move measuring head 10 in the longitudinal direction.

Figure 28:
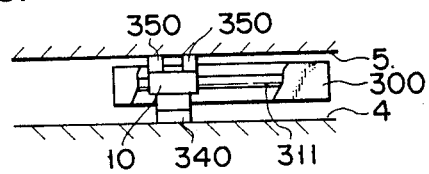

When guide frames 312 are rotated by wires 302 in the circumferential direction, measuring head 10 can be rotated in the circumferential direction in the same manner as in the operation of FIG. 28.

Movement of measuring head 10 in the longitudinal direction and its rotation in the circumferential direction will be described below. Assume that stepping mechanism 300 is moved in the longitudinal direction in FIG. 23. In this case, when pulley 262 is rotated counterclockwise, a rightward thrust is generated by wires 301 in FIG. 23. At this time, since wires 302 are slid through pulleys 305 and 307, and pulleys 308 and 310 arranged in stepping mechanism 300, pulley 306 arranged on measuring head 10, and pulley 309, wires 302 do not interfere the rightward thrust. Similarly, wires 302 do not interfere the leftward thrust either. A longitudinal thrust of measuring head 10 in stepping mechanism 300 is obtained by extension/contraction of the piston of cylinder 360. At this time, wires 302 are slid along pulleys and do not interfere movement of mechanism 300.

A thrust for rotating stepping mechanism 300 in the circumferential direction while measuring head 10 is fixed by urging mechanisms 340 is obtained as follows when head 10 is pivoted downward in FIG. 23. When pulley 264 is rotated counterclockwise, pulley 309 is pulled to come close to pulleys 308 and 310 by a predetermined distance. Pulley 306 is separated from pulleys 305 and 307 by the predetermined distance. For this reason, downward relative movement can be performed. At this time, when stepping mechanism drivers 250 and 260 are moved downward in FIG. 23 in synchronism with movement of stepping mechanism 300 along the circular rails constituted by upper and lower semicircular rails 201 and 202, wires 301 and 302 are balanced horizontally in FIG. 23. Downward movement is the same as the abovementioned downward movement in FIG. 23.

As described above, in the embodiment of FIG. 22, since the wedge measuring apparatus can be constituted without using rails 120, peripheral equipment of revolving electric machine 1 is not interfered with by an assembly space of rails 120.

FIG. 29 is a perspective view of a wedge measuring apparatus according to a third embodiment of the present invention, and FIG. 30 is a sectional view showing an air bag portion in FIG. 29. Three kinds of urging mechanisms 320, 330, and 340 are arranged in the previous embodiment. However, in this embodiment, only one type of urging mechanisms 340 is used, and air bag 321 expanding between rotor 4 and core 5 is arranged.

The present invention is not limited to the particular embodiments described above. Various changes and modifications may be made within the spirit and scope of the invention. A shift mechanism using wires 302 in the circumferential direction is not limited to the above arrangement. Cylinders similar to cylinder 360 may be arranged between guide frames 312 and stepping mechanism 300 to eliminate wires 302 and associated pulleys.

Shift of measuring head 10 by cylinder 360 in stepping mechanism 300 is not limited to the above arrangement. Third wires having right and left fixed ends (FIG. 23) at measuring head 10 may be kept taut between drivers 250 and 260 in the same manner as wires 301 and pulleys 252, 253, and 261 which are arranged for stepping mechanism 300.

Figure 34:
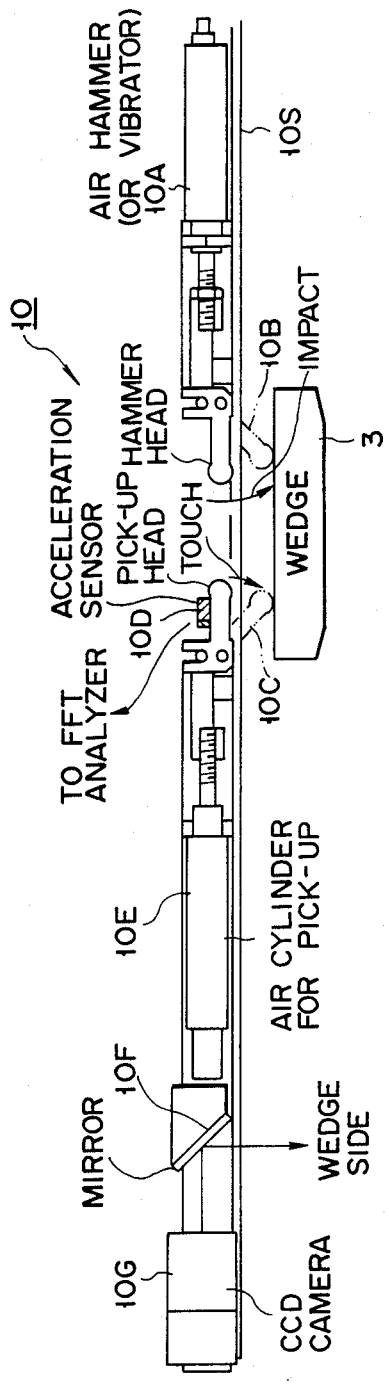
FIG. 34 is a plan view showing a measuring head used when a contact measurement is performed to test a slackened state of the wedge by vibration analysis.

FIG. 34 shows an arrangement of measuring head 10 used in contact measurement of wedge deflection by vibration analysis.

Hammer solenoid (air hammer) 10A driven by solenoid control 401f is fixed at the right position of chassis 10S of measuring head 10. When a drive pulse is applied to solenoid 10A, solenoid 10A temporarily pushes hammer head 10B. Hammer head 10B strikes with an impulse a predetermined position of wedge 3 located immediately below hammer head 10B.

A vibration of wedge 3 upon striking of wedge 3 with hammer head 10B is picked up by pickup head 10C which is in contact with wedge 3 at a position opposite to hammer head 10B. Pick-up head 10C is brought into contact with wedge 3 by air cylinder 10E.

An operation for moving heads 10B and 10C above wedge 3 to be measured can be performed while an operator monitors a video signal obtained by a combination of mirror 10F and compact CCD camera 10G which are located at left positions of chassis 10S.

FIG. 35 shows a basic hardware arrangement for performing vibration analysis of slackening of wedge 3 by using measuring head 10 in FIG. 34.

A vibration of wedge 3 which is mechanically detected by pick-up head 10C is converted into an electrical signal by acceleration sensor 10D with a hammer head. This electrical signal is transmitted to analyzing recorder 35A. This electrical signal is temporarily stored as raw vibration acceleration data in analyzing recorder 35A.

The raw data stored in analyzing recorder 35 is then analyzed by personal computer or engineering workstation 35B. An analysis result is displayed on CRT display 35C.

FIG. 36 is a block diagram showing procedures of vibration analysis by hardware (personal computer or engineering workstation 35B) in FIG. 35.

First, the vibration acceleration data of a marginally satisfactory wedge is fetched in analyzing recorder 35A as reference data (block 36B). Thereafter, the vibration acceleration data of each wedge 3 is fetched as actually measured data in analyzing recorder 35A by using measuring head 10 shown in FIG. 34 (block 36A).

The vibration acceleration data fetched by analyzing recorder 35A is given as a signal level as a function of time. This function can be transformed into a frequency function by a high-speed Fourier transformation using FFTs 36C and 36D.

Incidentally, when reference vibration acceleration data has been pre-measured, and if such reference data is stored in the memory of computer 35B (FIG. 35), then blocks 36B, 36D and 36F may be omitted. In this case, the comparison at block 36G is carried out between the stored reference data and the data obtained by blocks 36A, 36C, and 36E.

Figure 37:
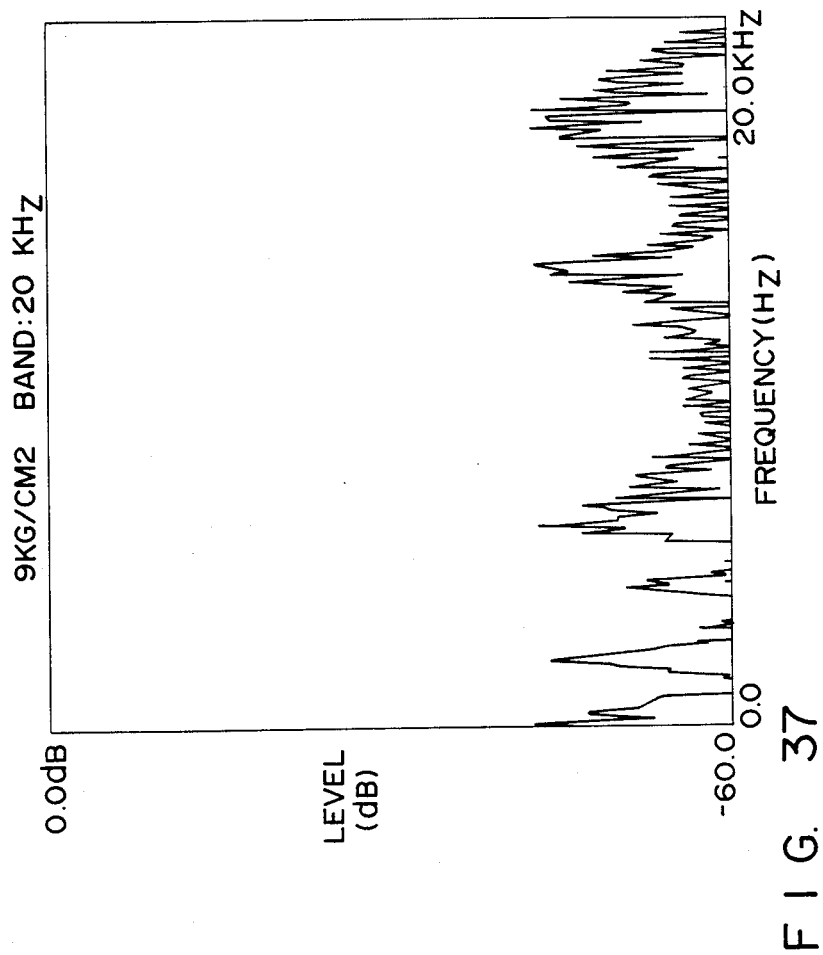
FIG. 37 is a graph showing a vibration frequency spectrum obtained by vibration analysis of FIG. 36 when wedges are firmly fixed in the corresponding coil slot (i.e., correction is not required)
Figure 38:
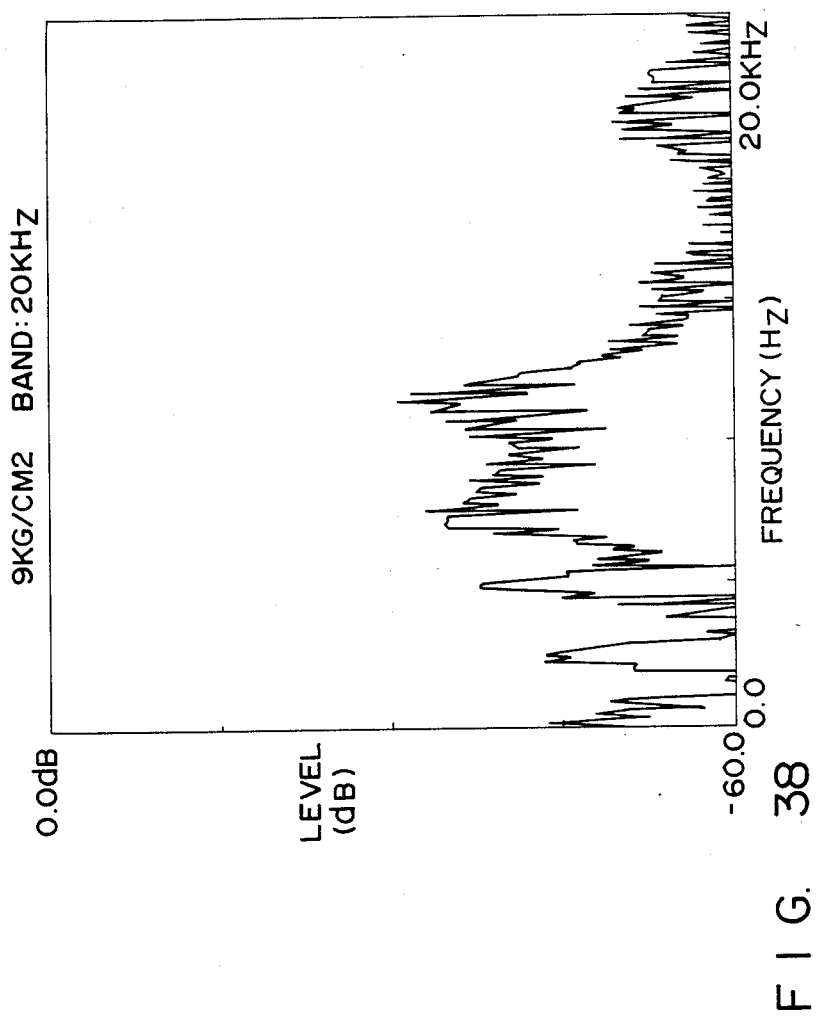
FIG. 38 is a graph showing a vibration frequency spectrum obtained by vibration analysis of FIG. 36 when wedges are slightly slackened (i.e., the wedge state is marginally satisfactory)
Figure 39:
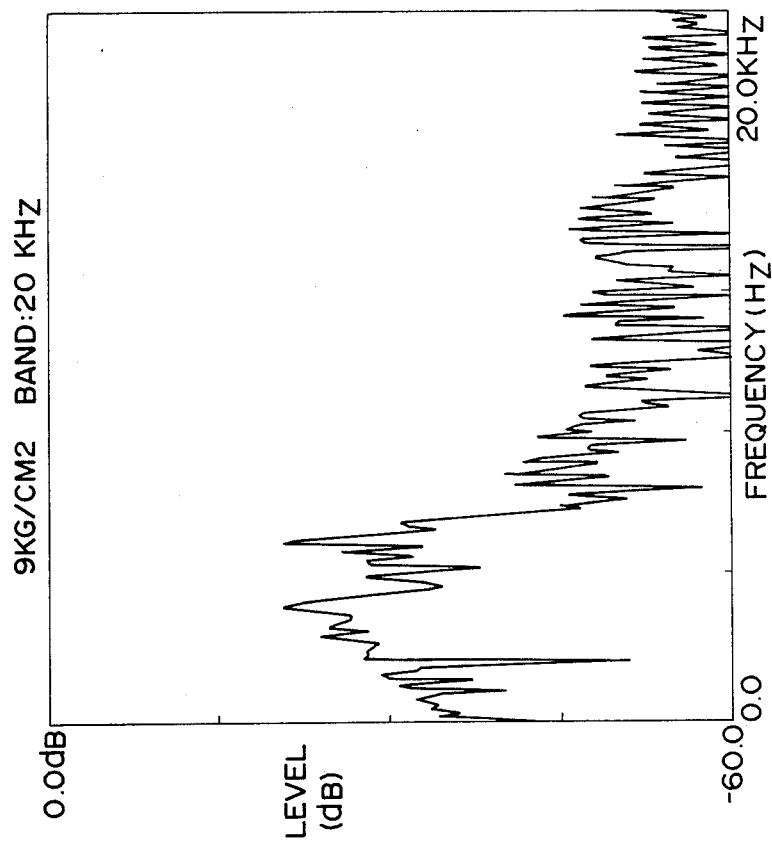
FIG. 39 is a graph showing a vibration frequency spectrum obtained by vibration analysis of FIG. 36 when the wedges are greatly slackened (i.e., correction is required)

The frequency-transformed vibration acceleration data are given as shown in FIGS. 37 to 39. FIG. 38 shows a frequency spectrum of reference data in a marginally satisfactory state (a marginally satisfactory state for correction requirements). FIG. 37 shows a frequency spectrum of actually measured data which represents that the wedge is firmly fixed in the coil slot (no correction is required). FIG. 39 shows a frequency spectrum of actually measured data obtained when the wedge is greatly slackened (correction is required).

After high-speed Fourier transformation is performed using FFTs 36C and 36D, an area of frequency response graph formed by waveform of the reference frequency spectrum shown in FIG. 38 is calculated (block 36F). Similarly, an area of frequency-response graph formed by the reference frequency spectrum in FIG. 37 or 39 is calculated (block 36E).

When the above areas are calculated, the area of the actually measured data (raw area data) is compared with that of the reference data (reference area data) (block 36G). When the raw area data (FIG. 39) is larger than the reference area data, wedge 3 which provides the raw area data is judged to be slackened (i.e., correction is required) (block 36H). However, when the raw area data (FIG. 37) is smaller than the reference area data, wedge 3 which provides the raw area data is judged to be kept tight (correction is not required) (block 36H).

The above judgment result is stored in a memory device (e.g., a RAM and a hard disk) and at the same time displayed on CRT 35C (block 36I).

Figure 40:
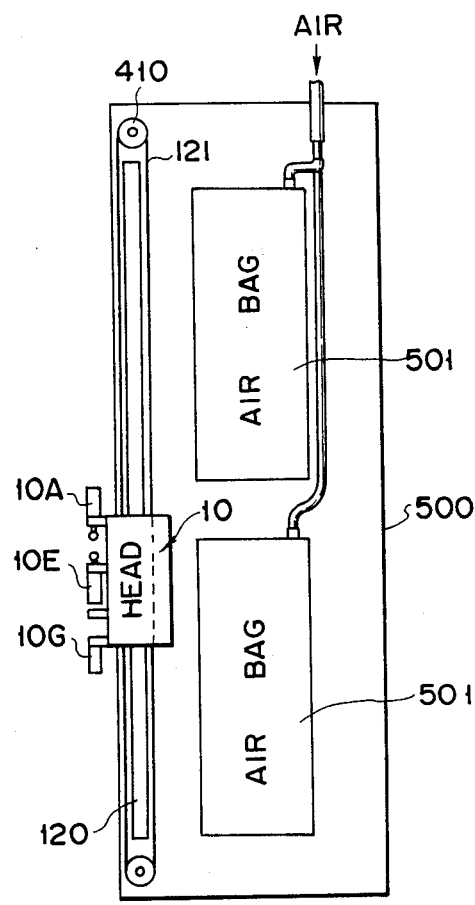
FIG. 40 is a plan view of a wedge measuring apparatus according to a fourth embodiment of the present invention.

FIG. 40 shows a wedge measuring apparatus according to a fourth embodiment of the present invention. In this case, chassis 500 has curvature which matches with curvature of gap 6 in revolving electric machine 1. Guide rail 120 extends at the left portion of chassis 500 along its longitudinal direction. Measuring head 10 shown in FIG. 34 is slidably carried on guide rail 120. Measuring head 10 along guide rail 120 is shifted by motor 410 through wire 121.

Two air bags 501 extend at the central portion of chassis 500 (the number of air bags may be one or three or more). Air bags 501 are kept deflated while the apparatus in FIG. 40 is inserted in gap 6 in revolving electric machine 1 or moved within gap 6. When the apparatus shown in FIG. 40 is fixed at a predetermined position in gap 6, air is supplied to these air bags 501 from a pump (not shown) to inflate them. Inflation of air bags 501 causes chassis 500 to urge against stator core 5. Therefore, chassis 500 is fixed in gap 6 during testing of wedge 3.

Figure 41:
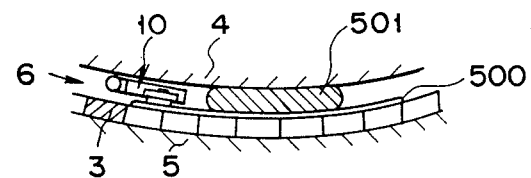
FIG. 41 is a sectional view showing a state in which the measuring apparatus shown in FIG. 40 inserted in the gap between the rotor and the stator is fixed by inflation of an air bag.

FIG. 41 shows a state wherein the measuring apparatus in FIG. 40 is kept fixed in gap 6 upon inflation of air bags 501.

Measuring head 10 can be fixed by the structure of, e.g., FIG. 29 during testing.

FIG. 42 shows a schematic arrangement of a hydraulic turbine generator which has a vertical rotating shaft and into which the wedge measuring apparatus in FIG. 40 is inserted. Since gap 6 between the rotor and stator of such a vertical revolving electric machine is parallel to the field of gravity, a wedge measuring apparatus inserted in gap 6 must have unique structural implementations. More specifically, one end of the upper portion of chassis 500 of the wedge measuring apparatus is set to be movable, and the other end is freely suspended or hanged in air in gap 6.

Figure 43:
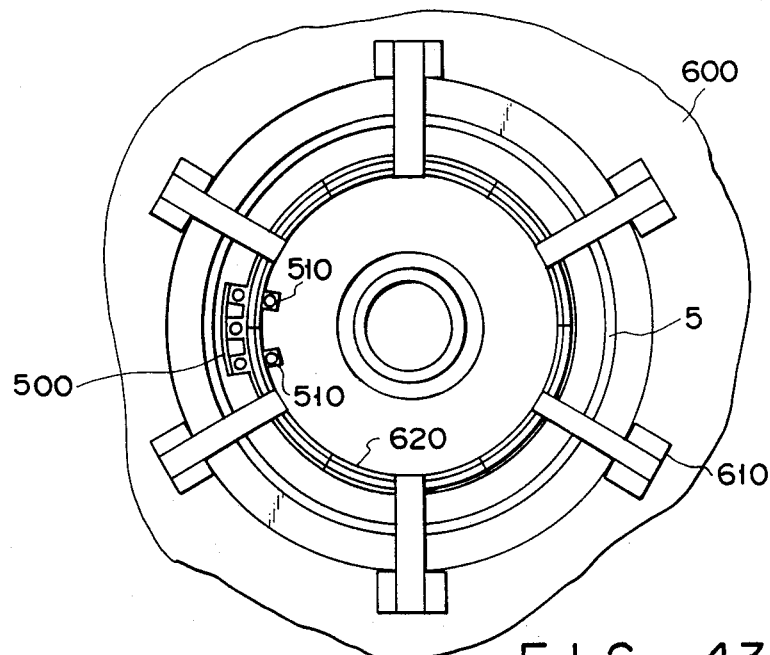
FIG. 43 is a plan view of the hydraulic turbine generator of FIG. 42 in which the rotor is not illustrated.
Figure 44:
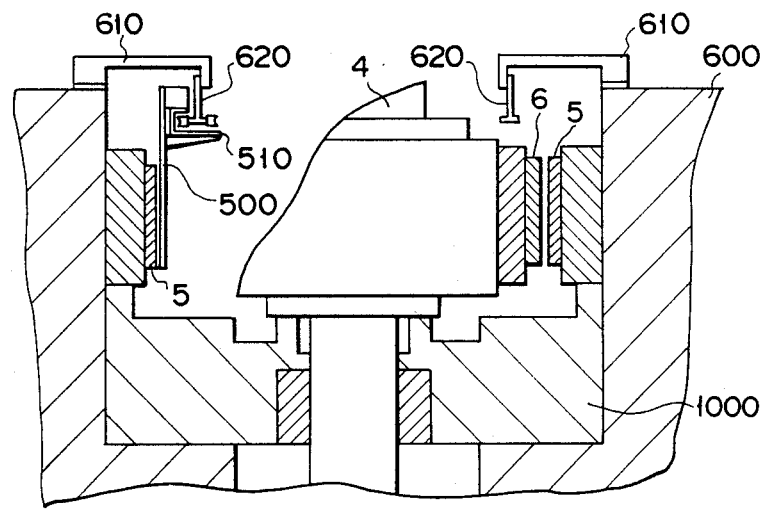
FIG. 44 is a partial side sectional view of the hydraulic turbine generator of FIG. 42 in which the rotor is illustrated.

FIG. 43 is a plan view of the hydraulic turbine generator of FIG. 42 in which rotor 4 is partially illustrated. FIG. 44 is a side sectional view of the hydraulic turbine generator of FIG. 42 in which rotor 4 is not illustrated. FIG. 45 shows a wedge measuring apparatus to be inserted in gap 6 in the hydraulic turbine generator shown in FIG. 42. FIG. 46 is a side view of the wedge measuring apparatus shown in FIG. 45, FIG. 47 is a bottom view thereof, and FIG. 48 is a plan view thereof.

Measuring head 10 which is slidable along guide rail 120, and three air bags 501 for fixing chassis 500 against stator core 5 are arranged on arcuated chassis 500 having curvature which matches that of gap 6 in the same manner as in FIG. 40. These air bags 501 are inflated when wedge 3 is measured by measuring head 10.

Four rollers 530 fitted on ring-like guide rail 620, and driving roller 540 which is in rolling contact with guide rail 620 together with rollers 530 are mounted on chassis 500. Driving roller 540 is coupled to a rotating shaft of motor 520. When motor 520 is driven during deflation of air bags 501, measuring head 10 carried on chassis 500 can be driven along the surface of stator core 5 of the hydraulic turbine generator along guide rail 620.

Ring-like guide rail 620 for suspending chassis 500 is fixed on main body 600 of the hydraulic turbine generator by hangers 610.

It should be noted that the wedge measuring apparatus according to the present invention is used in a state in which rotor 4 is kept mounted in the generator.

By employing the wedge measuring apparatus shown in FIG. 45, slackening of several thousands of wedges can be automatically measured accurately within a relatively short period of time without removing the rotor from the hydraulic turbine generator.

The present invention can be utilized in a variety of applications such as an application in a physical state (e.g., a deflection state and a taut state) of a structure installed in a narrow gap which is inaccessible. The present invention can also be used in a linear gap such as gaps in a linear motor and a magnetic gap in addition to an arcuated gap in a revolving electric machine.

The frequency spectrum analysis described with reference to FIGS. 35 to 39 is not limited to this. For example, frequency spectrum data of FIG. 38 may be divided into ten blocks every octave (i.e., 20 to 40 Hz, 40 to 80 Hz, 80 to 160 Hz, . . . 10 to 20 kHz), and the frequency spectrum area data of the divided blocks within each octave may be stored. These 10 octave reference data may be compared with corresponding raw octave data to perform more accurate judgment.

According to the present invention, there is provided a wedge measuring apparatus capable of easily and accurately detecting a coil-urging state of the wedge within a short period of time.

What is claimed is:

1. A wedge measuring apparatus applied to a structure having a first member having a surface with a slot in which a wedge is driven, and a second member which opposes the surface of said first member so as to be spaced apart therefrom by a predetermined gap, comprising:
    testing means, inserted in a gap formed between said first member and said second member, for testing a fitting state between said wedge and said slot; and
    shifting means for shifting said testing means in said gap.

2. An apparatus according to claim 1, wherein said first member is included in a stator of a revolving electric machine, and said second member is included in a rotor of said revolving electric machine.

3. An apparatus according to claim 1, wherein said first member is included in a stator of a hydraulic turbine generator, and said second member is included in a rotor of said hydraulic turbine generator.

4. An apparatus according to claim 1, wherein said testing means includes:
    position measuring means for measuring a deflection amount of said wedge; and
    means for judging on the basis of the deflection amount of said wedge measured by said position measuring means whether the fitting state between said wedge and said slot is satisfactory.

5. An apparatus according to claim 1, wherein said testing means includes:
    position measuring means for measuring a deflection amount of said wedge on the basis of a predetermined wedge reference position while being not in contact with said wedge; and
    means for judging on the basis of the deflection amount of said wedge measured by said position measuring means whether the fitting state between said wedge and said slot is satisfactory.

6. An apparatus according to claim 1, wherein said testing means includes:
    position measuring means, brought into contact with said wedge, for measuring a deflection amount of said wedge; and
    means for judging on the basis of the deflection amount of said wedge measured by said position measuring means whether the fitting state between said wedge and said slot is satisfactory.

7. An apparatus according to claim 1, wherein said testing means includes:
    vibration detecting means for applying a vibration to said wedge to detect a vibration state of said wedge; and
    means for judging on the basis of the vibration state of said wedge detected by said vibration detecting means whether the fitting state between said wedge and said slot is satisfactory.

8. An apparatus according to claim 7, wherein said vibration detecting means includes:
    vibrating means for applying a mechanical impulse to said wedge; and
    sensor means for sensing as an electrical signal the vibration state of said wedge which is obtained on the basis of the mechanical impulse.

9. An apparatus according to claim 8, wherein said vibration detecting means further includes:
    Fourier transforming means for Fourier-transforming the electrical signal detected by said sensor means and generating a vibration state signal having frequency characteristics corresponding to the vibration state of said wedge;
    means for comparing the frequency characteristics of the vibration state signal with predetermined reference data; and
    means for judging on the basis of a comparison result of said comparing means whether the fitting state between said wedge and said slot is satisfactory.

10. An apparatus according to claim 9, wherein said comparing means includes:
    means for integrating a frequency spectrum of the vibration state signal in a predetermined frequency width to obtain area data of the frequency spectrum; and
    means for comparing the area data with the predetermined reference data and outputting the comparison result to said judging means on the basis of a difference between the area data and the predetermined reference data.

11. An apparatus according to claim 7, wherein said vibration detecting means includes:

vibrating means for continuously applying a mechanical vibration to said wedge; and sensor means for detecting as an electrical signal a vibration state of said wedge which is obtained on the basis of the mechanical vibration.

12. An apparatus according to claim 11, wherein said vibration detecting means further includes:

means for comparing the frequency characteristics of the electrical signal detected by said sensor means with predetermined reference data; and means for judging on the basis of a comparison result of said comparing means whether the fitting state between said wedge and said slot is satisfactory.

13. An apparatus according to claim 1, further comprising:

holding means, inserted in said gap, for holding said shifting means; and fixing means, mounted on said holding means, for mechanically fixing said holding means in said gap.

14. An apparatus according to claim 13, wherein said fixing means includes an air bag for urging said holding means against said first member upon inflation thereof in said gap.

15. An apparatus according to claim 2, wherein said shifting means includes:

axial shifting means for shifting said testing means in said gap in a longitudinal direction of a rotating shaft of said rotor; and rotational direction shifting means for rotating said testing means in said gap in a rotational direction of said rotor.

16. An apparatus according to claim 15, further comprising fixing means for mechanically fixing said testing means in said gap.

17. An apparatus according to claim 1, wherein said testing means includes camera means for optically detecting a state of said wedge on the surface of said first member as a video image.

18. An apparatus according to claim 5, wherein said position measuring means includes means for measuring a position of said wedge while being not in contact with said wedge on the basis of a triangulation principle.

19. A measuring apparatus for testing a slackened state of a "wedge" for holding a coil of a revolving electric machine into a slot, comprising:

testing means, inserted in a gap between a rotor and a stator of said revolving electric machine, for testing a physical state of said wedge in said slot; and shifting means for movably holding said testing means and shifting said testing means in said gap in both longitudinal and circumferential directions of said stator.

20. An apparatus according to claim 19, wherein said testing means comprises video camera means for monitoring a position of said wedge.

21. An apparatus according to claim 19, wherein said testing means includes distance measuring means for measuring a distance between a predetermined reference position and the position of said wedge in a noncontact manner with said wedge.

22. An apparatus according to claim 19, wherein said testing means includes:

a probe which is brought into contact with or separated from said wedge;

distance measuring means for measuring a displacement of said probe; and a drive mechanism for bringing said probe into contact with said wedge during testing and separating said probe from said wedge during nontesting.

23. An apparatus according to claim 19, wherein said testing means includes:

vibrating means for applying a mechanical vibration to said wedge; and vibration measuring means for measuring a vibration amplitude and a vibration frequency of a predetermined portion of said wedge which is vibrated by said vibrating means.

24. An apparatus according to claim 19, wherein said testing means includes:

projecting means for emitting measuring light;

first light guide means for guiding the measuring light toward said wedge;

second light guide means for guiding the measuring light reflected by said wedge in a predetermined direction; and light-receiving means, located in the predetermined direction, for receiving the measuring light guided by said second light guide means, wherein the distance between a predetermined reference position and the position of said wedge is measured by a triangulation principle in a noncontact manner with said wedge.

25. An apparatus according to claim 19, wherein said shifting means comprises:

a longitudinal guide rail extending along the longitudinal direction of said stator;

a longitudinal drive mechanism for shifting said testing means along said longitudinal guide rail;

a circumferential guide rail arranged along a circumferential direction of said rotor; and a circumferential drive mechanism for rotating said testing means along said circumferential guide rail.

26. An apparatus according to claim 25, wherein said longitudinal drive mechanism comprises motors at both ends of said longitudinal guide rail.

27. An apparatus according to claim 19, further comprising:

for temporarily fixing said first fixing means shifting means in said gap; and second fixing means for temporarily fixing said testing means with respect to said shifting means.

28. An apparatus according to claim 19, wherein said shifting means comprises a wire/pulley mechanism for movably holding said testing means and shifting said testing means in said gap in the longitudinal direction of said stator.

29. A wedge measuring apparatus comprising:

a measuring head capable of being inserted in a gap between a stator and a rotor of a revolving electric machine, formed along an axial direction of an iron core of said stator, said measuring head being arranged to detect a coil-urging state of a wedge inserted in a slot having an opening in a surface opposite to said rotor so as to prevent radial extension of said coil from said opening; and a shift mechanism for shifting said measuring head in both longitudinal and circumferential directions of said stator.

30. A wedge measuring method applied to a structure having a first member having a surface with a slot in which a wedge is driven, and a second member which opposes the surface of said first member so as to be spaced apart therefrom by a predetermined gap, comprising:

inserting testing means for testing a fitting state between said wedge and said slot in a gap formed by said first member and said second member;

moving said testing means in said gap;

measuring a deflection amount of said wedge by said testing means; and judging on the basis of the deflection amount whether the fitting state between said wedge and said slot is satisfactory.

31. A method according to claim 30, wherein said testing means measures the deflection amount of said wedge on the basis of a predetermined wedge reference position while being not in contact with said wedge.

32. A method according to claim 30, wherein said testing means measures the deflection amount of said wedge while being in contact with said wedge.

33. A method according to claim 30, wherein said testing means applies a vibration to said wedge to detect a vibration state of said wedge, and judges on the basis of the vibration state of said wedge whether the fitting state between said wedge and said slot is satisfactory.

34. A method according to claim 30, wherein said testing means applies a mechanical impulse to said wedge, detects as an electrical signal the vibration state of said wedge which is obtained on the basis of the mechanical impulse, Fourier-transforms the electrical signal to form a vibration state signal having frequency characteristics corresponding to the vibration state of said wedge, compares the frequency characteristics of the vibration state signal with predetermined reference data, and judges on the basis of a comparison result whether the fitting state between the wedge and said slot is satisfactory.

35. A method according to claim 34, further comprising:

integrating the frequency spectrum of the vibration state signal in a predetermined frequency width to obtain area data of the frequency spectrum, and comparing the area data with the predetermined reference data and outputting the comparison result on the basis of a difference between the area data and the predetermined reference data.

36. A method according to claim 30, wherein said testing means emits measuring light, guides the measuring light toward said wedge, guides the measuring light reflected by said wedge in a predetermined direction, receives the guided measuring light, and measures a distance between a predetermined reference position and the position of said wedge on the basis of received optical information of said wedge in a noncontact manner with said wedge in accordance with a triangulation principle.

* * * * *